US012564101B2

(12) United States Patent (10) Patent No.: US 12,564,101 B2
Min et al. (45) Date of Patent: Feb. 24, 2026

(54) LIGHT EMITTING DEVICE AND LIGHT EMITTING MODULE INCLUDING THE SAME

(71) Applicant: SEOUL VIOSYS CO., LTD., Gyeonggi-do (KR)

(72) Inventors: Dae Hong Min, Gyeonggi-do (KR); Yong Hyun Baek, Gyeonggi-do (KR); Ji Hun Kang, Gyeonggi-do (KR); Chung Hoon Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 419 days.

(21) Appl. No.: 18/088,650

(22) Filed: Dec. 26, 2022

(65) Prior Publication Data

US 2023/0215846 A1 Jul. 6, 2023

Related U.S. Application Data

(60) Provisional application No. 63/295,069, filed on Dec. 30, 2021, provisional application No. 63/299,260, (Continued)

(51) Int. Cl.
*H01L 25/075* (2006.01)
*H01L 33/06* (2010.01)
(Continued)

(52) U.S. Cl.
CPC ....... *H01L 25/0753* (2013.01); *H10H 20/812* (2025.01); *H10H 20/825* (2025.01)

(58) Field of Classification Search
CPC ... H01L 25/0753; H01L 25/075; H01L 25/07; H01L 25/00; H10H 20/812;
(Continued)

(56) References Cited

U.S. PATENT DOCUMENTS 10,756,134 B2 * 8/2020 Chung ................. H10H 20/857
2009/0206322 A1 8/2009 Brandes
(Continued)

FOREIGN PATENT DOCUMENTS

KR 10-0552333 B1 2/2006
KR 20-0410859 Y1 3/2006
(Continued)

OTHER PUBLICATIONS

English translation of International Search Report for PCT/KR2022/021405, mailed Apr. 14, 2023, 3 pages.
(Continued)

*Primary Examiner* — Nikolay K Yushin
(74) *Attorney, Agent, or Firm* — LaBatt, LLC

(57) ABSTRACT

A light emitting device according to an exemplary embodiment includes a first light emission region and a second light emission region. The first and second light emission regions include a first conductivity type semiconductor layer, a second conductivity type semiconductor layer, and an active region formed between the first conductivity type semiconductor layer and the second conductivity type semiconductor layer, respectively, an area of the first light emission region is larger than an area of the second emission region, and at least one of the first emission region or the second emission region emits light of a plurality of peak wavelengths.

18 Claims, 15 Drawing Sheets

Related U.S. Application Data filed on Jan. 13, 2022, provisional application No. 63/391,610, filed on Jul. 22, 2022.

(51) Int. Cl.
H10H 20/812 (2025.01)
*H10H 20/825* (2025.01)

(58) Field of Classification Search
CPC .. H10H 20/825; H10H 20/821; H10H 20/851; H10H 20/011
See application file for complete search history.

(56) References Cited

U.S. PATENT DOCUMENTS

| | | |
|---|---|---|
| 2010/0224857 A1 | 9/2010 | Soh et al. |
| 2017/0181241 A1 | 6/2017 | Koo |
| 2018/0277590 A1* | 9/2018 | Chung ................. H10H 20/831 |
| 2020/0365649 A1* | 11/2020 | Jang ..................... H10H 20/831 |
| 2021/0328100 A1 | 10/2021 | Baek et al. |

FOREIGN PATENT DOCUMENTS

| | | |
|---|---|---|
| KR | 10-2010-0069676 A | 6/2010 |
| KR | 10-1666836 B1 | 10/2016 |
| KR | 10-2017-0040451 A | 4/2017 |

OTHER PUBLICATIONS

Extended European Search Report for European Patent Application No. 22916702.8, Oct. 17, 2025, 12 pages.

Chuai et al., "A Trichromatic Phosphor-Free White Light-Emitting Diode by Using Adhesive Bonding Scheme," Proc. SPIE 7635, Display, Solid-State Lighting, Photovoltaics, and Optoelectronics in Energy, Nov. 25, 2009, 2 pages.

\* cited by examiner

FIG. 7 (Amended)
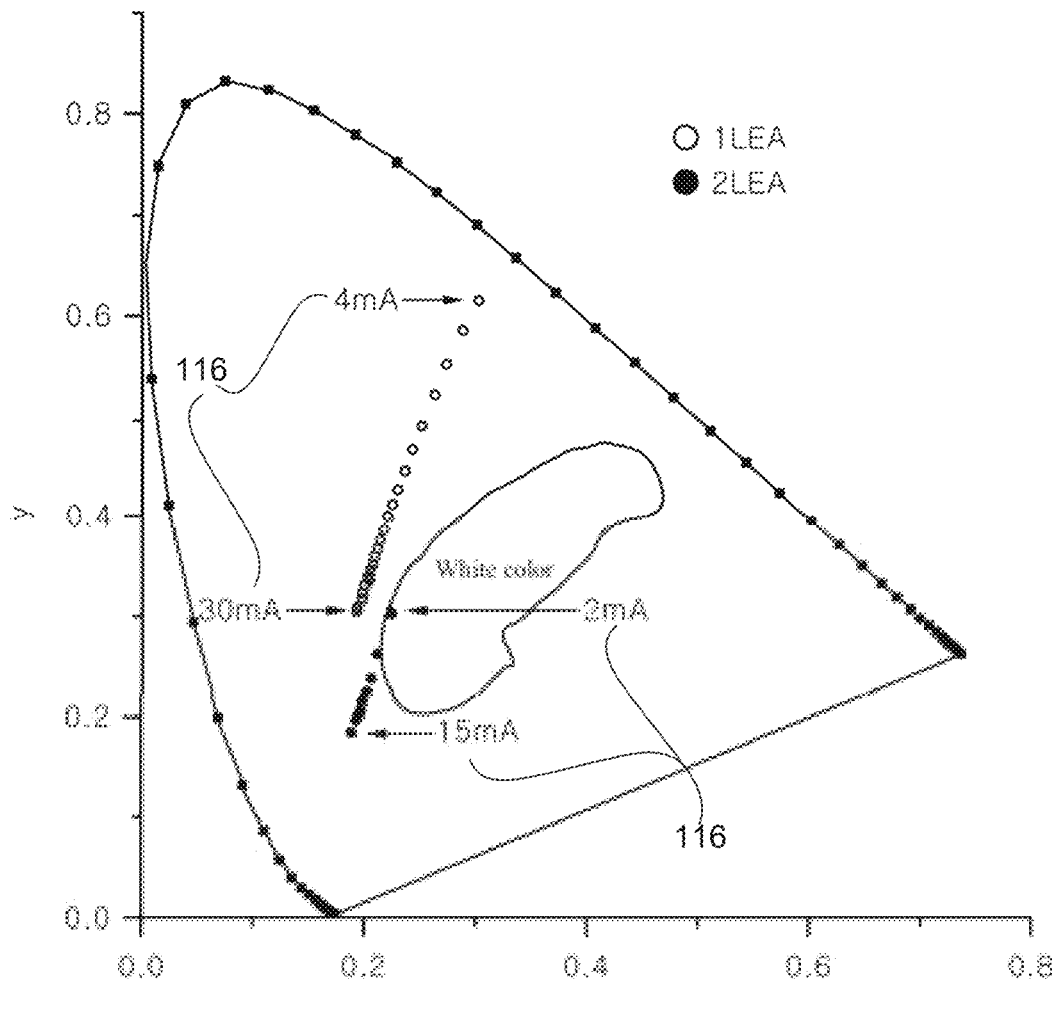

LIGHT EMITTING DEVICE AND LIGHT EMITTING MODULE INCLUDING THE SAME

CROSS-REFERENCE TO RELATED APPLICATIONS

The current application claims priority to and the benefit of U.S. Provisional Application No. 63/295,069, filed 30 Dec. 2021, U.S. Provisional Application No. 63/299,260, filed 13 Jan. 2022, and U.S. Provisional Application No. 63/391,610, filed 22 Jul. 2022, each of which is incorporated herein by reference.

TECHNICAL FIELD

The present disclosure relates to a light emitting device and a light emitting module including the same.

BACKGROUND

Nitride semiconductors are used as light sources for displaying apparatuses, traffic lights, lighting, or optical communication devices, and may be mainly used for light emitting diodes or laser diodes that emit blue or green light. In addition, the nitride semiconductors may be used in a heterojunction bipolar transistor (HBT), a high electron mobility transistor (HEMT), and the like.

In general, a light emitting diode using the nitride semiconductor has a heterojunction structure having a quantum well structure between an N contact layer and a P contact layer. The light emitting diode emits light of a specific wavelength depending on a composition of a well layer in the quantum well structure. To increase internal quantum efficiency and reduce losses due to light absorption, the light emitting diode is designed to emit a spectrum of light having a single peak, i.e., monochromatic light.

However, in general, lighting is implemented with mixed color light, for example, white light. Moreover, in order to control color temperature and luminance according to a person's psychological state, such as emotional lighting, it is necessary to implement various mixed light. Lighting requiring mixed-color light cannot be implemented with single-peak monochromatic light. Accordingly, a technique for implementing white light using a plurality of light emitting diodes emitting different monochromatic lights together or using a phosphor that converts a wavelength of light emitted from a light emitting diode is generally used.

SUMMARY

Exemplary embodiments of the present disclosure provide a light emitting device having a novel structure to implement white light without using a phosphor, and a light emitting module having the same.

A light emitting device according to an exemplary embodiment of the present disclosure includes a first light emission region and a second light emission region. The first and second light emission regions include a first conductivity type semiconductor layer, a second conductivity type semiconductor layer, and an active region formed between the first conductivity type semiconductor layer and the second conductivity type semiconductor layer, respectively, an area of the first light emission region is larger than that of the second emission region, and at least one of the first emission region or the second emission region emits light of a plurality of peak wavelengths.

Upon operation, the first light emission region and the second light emission region may be operated under different current densities from each other.

The first light emission region may be connected in series or parallel to the second light emission region.

The light emitting device may further include a substrate, and the first light emission region and the second light emission region may be disposed on the substrate.

The first emission region may have an active region having a same composition as that of the second emission region.

The light emitting device may further include a first substrate and a second substrate spaced apart from the first substrate, in which the first light emission region may be disposed on the first substrate, and the second light emission region may be disposed on the second substrate.

The first emission region and the second emission region may emit light of a plurality of peak wavelengths, respectively, and peak wavelengths of light emitted from the first emission region and the second emission region are substantially same, but intensities at respective peak wavelengths may be different from each other.

The light emitting device may further include a wavelength converter covering the first light emission region and the second light emission region, and the wavelength converter may include a wavelength conversion material converting light emitted from the first light emission region and the second light emission region into light of a longer wavelength.

In an exemplary embodiment, the first light emission region and the second light emission region may be stacked on each other.

The light emitting device may further include an intermediate layer disposed between the first light emission region and the second light emission region.

The intermediate layer may be a tunnel junction layer or a bonding layer.

The light emitting device may further include a third light emission region stacked on the second light emission region, in which the third light emission region may include a first conductivity type semiconductor layer, a second conductivity type semiconductor layer, and an active region disposed between the first conductivity type semiconductor layer and the second conductivity type semiconductor layer.

The first light emission region may have an area equal to or greater than 1.2 times of that of the second light emission region.

The active region may include a lower multi-quantum well structure and an upper multi-quantum well structure formed between the first conductivity type semiconductor layer and the second conductivity type semiconductor layer; and a gap layer disposed between the lower multi-quantum well structure and the upper multi-quantum well structure.

The light emitting device may further include a V-pit generation layer disposed between the first conductivity type semiconductor layer and the lower multi-quantum well structure.

In the light emitting device, x and y values of CIE color coordinates may decrease as an applied current increases.

The light emitting device may emit light having x and y ranges of $0.205 < x < 0.495$, $0.19 < y < 0.45$ in the CIE color coordinates.

A light emitting module according to an exemplary embodiment of the present disclosure includes a first light emission region and a second light emission region. The first and second light emission regions include a first conductivity type semiconductor layer, a second conductivity type semiconductor layer, and an active region formed between the first conductivity type semiconductor layer and the second conductivity type semiconductor layer, respectively, an area of the first light emission region is larger than that of the second emission region, and at least one of the first emission region or the second emission region emits light of a plurality of peak wavelengths.

The light emitting module may include a first light emitting diode chip and a second light emitting diode chip, in which the first light emitting diode chip includes the first light emission region, and the second light emitting diode chip includes the second light emission region.

The light emitting module may further include a wavelength converter covering the first and second light emitting diode chips, and the wavelength converter includes a wavelength conversion material converting light emitted from the first light emission region and the second light emission region into light of a longer wavelength.

The light emitting module may further include a circuit board, in which the first light emission region and the second light emission region may be electrically connected to the circuit board.

The light emitting module may further include a housing, in which the first light emission region and the second light emission region may be disposed in the housing.

BRIEF DESCRIPTION OF THE DRAWINGS

FIG. 7 is a CIE graph illustrating changes in color coordinates according to current densities of a light emitting device having a single light emission region and a light emitting device having a plurality of light emission regions.

DETAILED DESCRIPTION OF EMBODIMENTS

Figure 1:
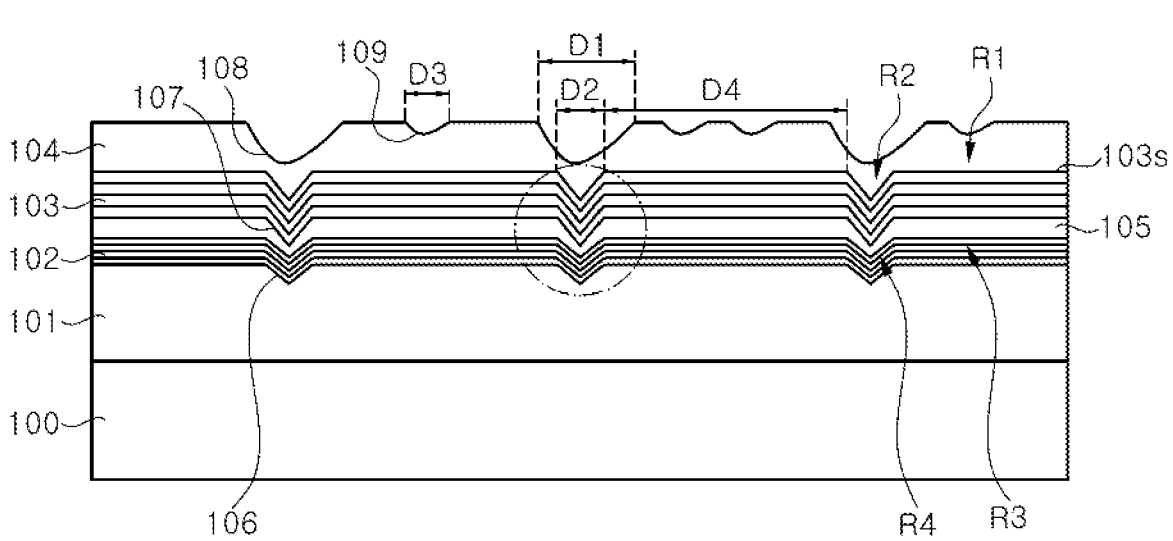
FIG. 1 is a schematic cross-sectional view illustrating a light emitting diode according to an exemplary embodiment.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the exemplary embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 2:
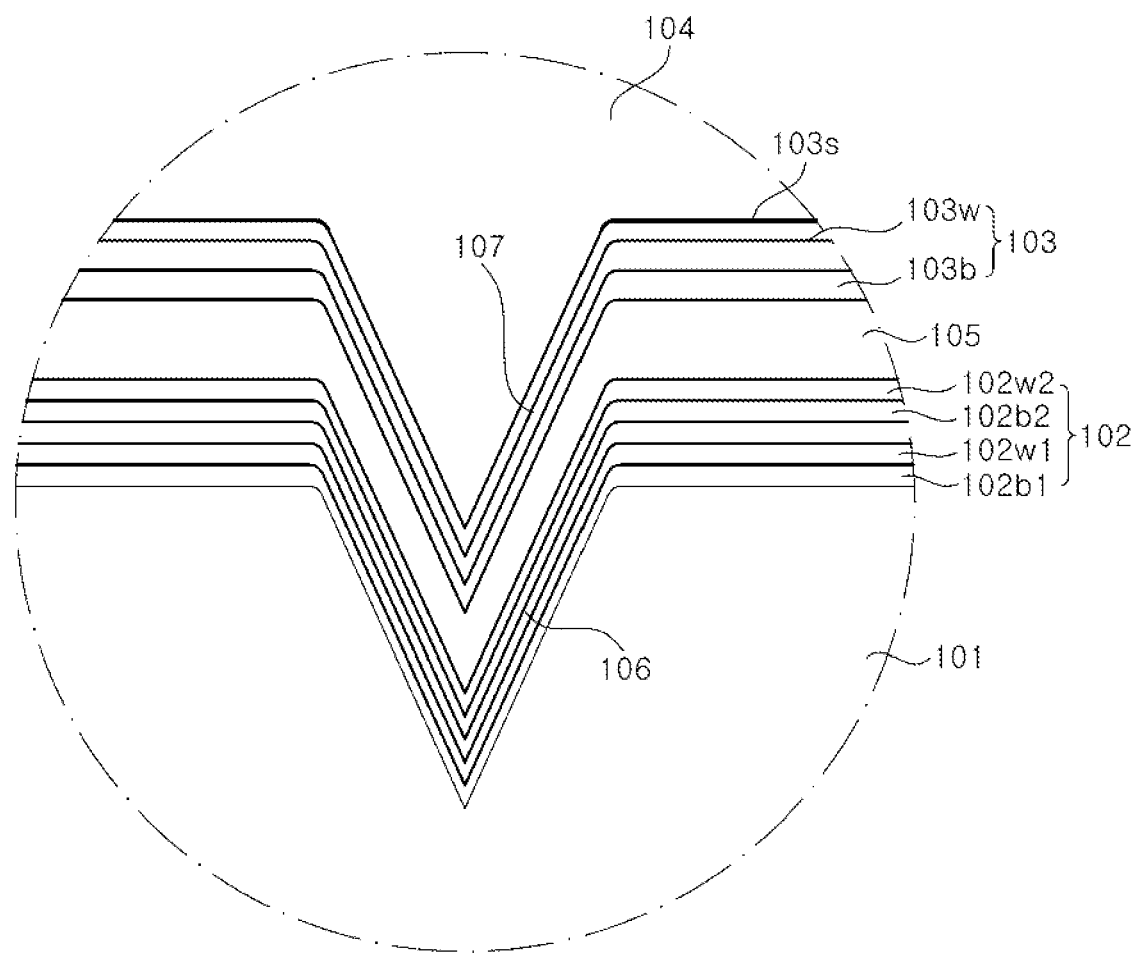
FIG. 2 is a partially enlarged cross-sectional view of the light emitting diode shown in FIG. 1.

FIG. 1 is a schematic cross-sectional view illustrating a light emitting diode according to an exemplary embodiment of the present disclosure, and FIG. 2 is a partially enlarged cross-sectional view of the light emitting diode shown in FIG. 1.

Referring to FIG. 1 and FIG. 2, in the illustrated exemplary embodiment, the light emitting diode may include a substrate 100, a first conductivity type semiconductor layer 101, a lower multi-quantum well structure 102, an upper multi-quantum well structure 103, a second conductivity type semiconductor layer 104, a gap layer 105, and a step coverage layer 103$s$.

In the illustrated exemplary embodiment, the substrate 100 may be a growth substrate for growing a gallium nitride-based semiconductor layer, for example, a sapphire substrate, a silicon substrate, a SiC substrate, a spinel substrate, or the like. In an exemplary embodiment, the substrate 100 may be a patterned sapphire substrate.

The first conductivity type semiconductor layer 101 may be multiple layers, and may include, for example, a nucleation layer, a high-temperature buffer layer, an n-type impurity doped layer, and the like. In addition, the first conductivity type semiconductor layer 101 may include a plurality of grooves on an upper surface thereof. A semiconductor layer formed over the first conductivity type semiconductor layer 101 may be, for example, a GaN layer, and a plurality of grooves may be formed by growing the GaN layer at a temperature of about 900° C. or less.

As shown in FIG. 1, the second conductivity type semiconductor layer 104 is disposed over the first conductivity type semiconductor layer 101. The second conductivity type semiconductor layer 104 may be formed of a single layer or multiple layers, and may include, for example, a layer doped with a p-type impurity.

The lower multi-quantum well structure 102 and the upper multi-quantum well structure 103 may be disposed between the first conductivity type semiconductor layer 101 and the second conductivity type semiconductor layer 104, and the gap layer 105 may be disposed between the lower multi-quantum well structure 102 and the upper multi-quantum well structure 103.

As shown in FIG. 2, the lower multi-quantum well structure 102 may be formed on the first conductivity type semiconductor layer 101. The lower multi-quantum well structure 102 has a structure in which barrier layers 102*b*1 and 102*b*2 and well layers 102*w*1 and 102*w*2 are alternately stacked. The well layers 102*w*1 and 102*w*2 have compositions for emitting light having a first wavelength. For example, the well layers 102*w*1 and 102*w*2 may be formed of an InGaN layer or an AlInGaN layer, and may emit light of an ultraviolet, blue, or green region. For example, In contents included in the well layers 102*w*1 and 102*w*2 may be 18 atomic % or less, and further, may be 12 atomic % or less with respect to all Group 3 elements. Also, a difference in the In contents included in the well layers 102*w*1 and 102*w*2 may be within 3%.

In another exemplary embodiment, the lower multi-quantum well structure 102 may include a first group of well layers 102*w*1 and a second group of well layers 102*w*2, and the first group of well layers 102*w*1 may have a relatively higher In content than that of the second group of well layers 102*w*2. In particular, the second group of well layers 102*w*2 may be disposed between the first group of well layers 102*w*1 and the upper multi-quantum well structure 103. For example, the first group of well layers 102*w*1 may include an In content having 10 atomic % or more, and the second group of well layers may include an In content having less than 10 atomic %. The barrier layers 102*b*1 and 102*b*2 may have same compositions, without being limited thereto, and the barrier layers 102*b*1 disposed between the first group of well layers 102*w*1 may have a lower Al content than that of the barrier layers 102*b*2 disposed between the second group of well layers 102*w*2.

In another exemplary embodiment, the first group of well layers 102*w*1 and the second group of well layers 102*w*2 may have substantially similar In contents. In particular, the difference in the In contents included in the well layers 102*w*1 and 102*w*2 may be within 3%, and a difference in energy band gaps of the well layers 102*w*1 and 102*w*2 may be 0.084 eV or less.

The upper multi-quantum well structure 103 is disposed over the lower multi-quantum well structure 102, and has a structure in which barrier layers 103*b* and well layers 103*w* are alternately stacked. The well layer 103*w* has a composition for emitting light of a second wavelength. Light of the second wavelength may have a longer wavelength than light of the first wavelength. For example, the well layer 103*w* may be formed of an InGaN layer or an AlInGaN layer, and may emit light in a green or red region. For example, an In content included in the well layer 103*w* may be 15 atomic % or more, and less than 30 atomic % with respect to all Group 3 elements.

Meanwhile, the barrier layers 103*b* in the upper multi-quantum well structure 103 may be thicker than the barrier layers 102*b* in the lower multi-quantum well structure 102. In addition, the well layers 103*w* in the upper multi-quantum well structure 103 may be thicker than the well layers 102*w* in the lower multi-quantum well structure 102. Since the upper multi-quantum well structure 103 is close to the second conductivity type semiconductor layer 104, the barrier layers 103*b* may be formed to be relatively thick to prevent electrons and holes from overflowing. Meanwhile, since the lower multi-quantum well structure 102 is relatively far from the second conductivity type semiconductor layer 104, thicknesses of the barrier layers 102*b*1 and 102*b*2 may be relatively small such that holes are well distributed in the lower multi-quantum well structure 102. For example, the barrier layers 102*b*1 and 102*b*2 may have thicknesses of 4 nm to 7 nm, and the barrier layers 103*b* may have thicknesses of 8 nm to 15 nm.

As shown in FIG. 1, the upper multi-quantum well structure 103 may include a first region R1 and a second region R2. The first region R1 may have a substantially flat surface, and the second region R2 may form a groove. The first region R1 may be observed as a plurality of regions in the cross-sectional view of FIG. 1. In plan view, the first region R1 surrounds a plurality of second regions R2. The second regions R2 may be disposed on grooves formed over the first conductivity type semiconductor layer 101. The barrier layers 103*b* and the well layers 103*w* of the upper multi-quantum well structure 103 are continuously disposed in the first region R1 and the second region R2. Upper surfaces of the barrier layers 103*b* and the well layers 103*w* may have curved shapes at a location where the first region R1 and the second region R2 meet. Accordingly, it is possible to prevent cracks from occurring in the barrier layers 103*b* or the well layers 103*w*, and thus, charge leakage may be prevented.

However, the barrier layers 103*b* and the well layers 103*w* have different thicknesses in the first region R1 and the second region R2. That is, as shown in FIG. 2, the thicknesses of the barrier layers 103*b* and the well layers 103*w* in the first region R1 may be formed larger than those of the barrier layers 103*b* and the well layers 103*w* in the second region R2. Furthermore, In contents in the well layers 103*w* of the second region R2 are less than In contents in the well layers 103*w* in the first region R1. Accordingly, the multi-quantum well structure 103 includes a multi-quantum well structure in the first region R1 and a multi-quantum well structure 107 in the second region. The multi-quantum well structure of the first region R1 may emit light of the second wavelength described above, whereas the multi-quantum well structure 107 of the second region R2 may emit light of a third wavelength having a shorter wavelength than that of light of the second wavelength. The light of the third wavelength may be light of a shorter wavelength, a longer wavelength, or a same wavelength with respect to light of the first wavelength emitted from the lower multi-quantum well structure 102.

For example, In contents in the well layers $103w$ in the first region R1 may be 15 atomic % or more and less than 30 atomic % with respect to all group 3 elements so as to emit light of the first wavelength. On the contrary, In contents in the well layers $103w$ in the second region R2 may be less than about 7 to about 12 atomic %, further, about 8 to about 10 atomic % with respect to all group 3 element so as to emit light of the third wavelength.

A width D4 of the first region R1 may be greater than a width D2 of the second region R2, and thus, a relatively wide flat surface may be formed on the second conductivity type semiconductor layer 104 formed on the upper multi-quantum well structure 103, and an electrode may be easily formed on the second conductivity type semiconductor layer 104.

As shown in FIG. 2, the lower multi-quantum well structure 102 may also include a third region R3 having a flat surface and a fourth region R4 forming a groove. Thicknesses of the barrier layers $102b1$ and $102b2$ and the well layers $102w1$ and $102w2$ in the third region R3 may be greater than those of the barrier layers $102b1$ and $102b2$ and the well layers $102w$ in the fourth region R4. The fourth regions R4 are disposed under the second regions R2. At least portions of the groove of the second region R2 and the groove of the fourth region R4 may overlap in a vertical direction. In addition, a portion closest to the substrate 100 in the second region R2 may be disposed in a groove region of the fourth region R4.

As shown in FIG. 2, the lower multi-quantum well structure 102 may emit light of the first wavelength in the third region R3 described above, and a multi-quantum well structure 106 in the fourth region R4 may not emit light. However, the inventive concepts are not limited thereto, and the multi-quantum well structure 106 in the fourth region R4 may emit light of a shorter wavelength than that of light of the first wavelength.

The number of pairs of layers constituting the lower multi-quantum well structure 102 affects a peak intensity of light of the first wavelength. As the number of pairs of the lower multi-quantum well structure 102 increases, light of the first wavelength, for example, a peak intensity of the blue region may increase. In addition, the number of pairs of the lower multi-quantum well structure 102 and the number of pairs of the upper multi-quantum well structure 103 may be adjusted differently. For example, the number of pairs of the lower multi-quantum well structure 102 may be greater than that of the upper multi-quantum well structure 103, and thus, the peak intensity of light of the first wavelength may be set to be lower than that of light of the second wavelength. Furthermore, the well layers of the lower multi-quantum well structure 102 may be divided into the groups having different band gaps from one another as described above.

In another exemplary embodiment, the number of pairs of the lower multi-quantum well structure 102 may be smaller than that of the upper multi-quantum well structure 103. Accordingly, in a spectrum of light emitted from a light emitting device 301, a peak intensity of a shorter wavelength region may be smaller than that of a longer wavelength region.

As shown in FIG. 1, the gap layer 105 may be disposed between the lower multi-quantum well structure 102 and the upper multi-quantum well structure 103. The gap layer 105 may have a band gap that is wider than or equal to that of the barrier layer $102b2$ in the lower multi-quantum well structure 102. Alternatively, the gap layer 105 may have the refractive index equal to or smaller than those of the barrier layers $102b1$ and $102b2$ in the lower multi-quantum well structure 102. When the gap layer 105 has a refractive index smaller than that of the barrier layers $102b1$ and $102b2$, light generated from the lower multi-quantum well structure 102 has a larger refractive angle by the gap layer having the relatively smaller refractive index, and thus, light generated in the lower multi-quantum well structure 102 may be emitted in a lateral direction, so that an amount of light entering the upper multi-quantum well structure 103 may be reduced, thereby increasing a light emission intensity of the light emitting diode. The gap layer 105 may include GaN, AlGaN, or AlInGaN. By adjusting the band gap of the gap layer 105, a concentration of holes injected into the lower multi-quantum well structure 102 may be controlled, and through this, an intensity of light emitted from the lower multi-quantum well structure 102 may be controlled. For example, when the gap layer 105 includes a relatively high Al content and has a wide band gap, the gap layer 105 prevents holes from being injected into the lower multi-quantum well structure 102. Accordingly, the number of electron-hole pairs in the lower multi-quantum well structure 102 decreases, thereby reducing an emission intensity. Conversely, the number of holes trapped in the upper multi-quantum well structure 103 increases, and thus, an emission intensity of the upper multi-quantum well structure 103 will increase. A thickness of the gap layer 105 also affects hole injection.

As described above, by adjusting the numbers of pairs of the lower multi-quantum well structure 102 and the upper multi-quantum well structure 103 and the band gap and the thickness of the gap layer 105, relative light emission intensities of the lower multi-quantum well 102 and the upper multi-quantum well structure 103 may be controlled.

As shown in FIG. 1 and FIG. 2, the step coverage layer $103s$ is disposed on the upper multi-quantum well structure 103. The step coverage layer $103s$ may have a wider band gap than the barrier layer $103b$ of the upper multi-quantum well structure 103. The step coverage layer $103s$ may be formed of, for example, AlGaN or AlInGaN. The step coverage layer $103s$ may include a structure in which an Al content changes as a distance from the upper multi-quantum well structure 103 increases. The step coverage layer $103s$ having the structure in which the A1 content changes may include a plurality of layers. The plurality of layers may have different band gaps from one another, and these layers may be stacked. Holes are uniformly distributed in a plane direction in the light emitting diode by the layers having different band gaps, and thus, the holes may be uniformly injected into the groove region and a flat region. The step coverage layer $103s$ having the structure in which the Al content changes may have a structure in which layers having different refractive indices from one another are stacked. Even when light having of wavelengths is emitted from the upper multi-quantum well structure 103 and the lower multi-quantum well structure 102, since the layers having the different refractive indices are disposed on the step coverage layer $103s$, a light refraction coverage for light of a plurality wavelengths is increased, and thus, mixing of light of the plurality of wavelengths is facilitated, thereby increasing an efficiency of white light through the semiconductor layer.

In another exemplary embodiment, the step coverage layer $103s$ may be an Al grading layer in which an Al content decreases as a distance from the upper multi-quantum well structure 103 increases. For example, the Al content in the step coverage layer $103s$ may decrease in a thickness direction from 30 atomic % or more to 10 atomic % or less. A thickness of the step coverage layer $103s$ may be less than about 100 nm, and in a certain exemplary embodiment, the thickness thereof may be less than about 50 nm, further, less than about 30 nm.

By forming the step coverage layer 103s as the grading layer, it is possible for holes to be easily injected into the upper multi-quantum well structure 103, and also to facilitate to generate light of the third wavelength in the second region R2 of the upper multi-quantum well structure 103.

The second conductivity type semiconductor layer 104 may be disposed on the step coverage layer 103s. The second conductivity type semiconductor layer 104 may include surface grooves 108 corresponding to the second regions R2. An entrance width of the surface groove 108 may be greater than those of the grooves of the second regions R2. In addition, a sub-surface groove 109 may also be formed over the first region R1, and an entrance width of the sub-surface groove 109 may be smaller than that of the surface groove 108. A light extraction efficiency may be improved by varying sizes of the surface grooves 108 and 109. Furthermore, the surface grooves 108 and 109 may increase a contact area of an ohmic electrode such as ITO, and thus, a driving voltage may be lowered and a reliability of the light emitting device 301 may be improved.

In the illustrated exemplary embodiment, the light emitting diode including the lower multi-quantum well structure 102, the gap layer 105 and the step coverage layer 103s has been described, but in the light emitting diode of the illustrated exemplary embodiment, at least one of the lower multi-quantum well structure 102, the gap layer 105, and the step coverage layer 103s may be omitted.

A light emitting device having various structures may be provided using the light emitting diode described with reference to FIG. 1 and FIG. 2, and the light emitting device includes an electrical connection structure for being electrically connected to a circuit pattern. For example, the light emitting device may include an ohmic layer in ohmic contact with the first and second conductivity type semiconductor layers 101 and 104, and electrode pads. Hereinafter, various light emitting devices using the light emitting diodes described with reference to FIG. 1 and FIG. 2 will be described.

Figure 3:
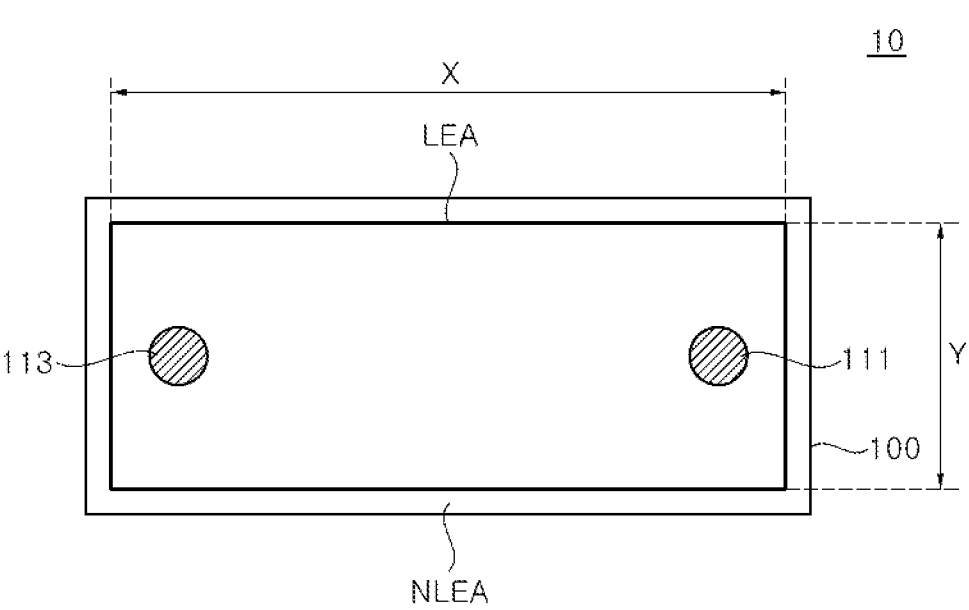
FIG. 3 is a schematic plan view illustrating a light emitting device having a single light emission region according to an exemplary embodiment of the present disclosure.

FIG. 3 is a schematic plan view illustrating a light emitting device having a single light emission region according to an exemplary embodiment of the present disclosure.

Referring to FIG. 3, a light emitting device 10 may include a substrate 100, a light emission region LEA, and electrode pads 111 and 113. Since the substrate 100 is same as the substrate 100 described with reference to FIG. 1 and FIG. 2, a detailed description thereof will be omitted.

The light emission region LEA is formed using the semiconductor layers described with reference to FIG. 1 and FIG. 2. The light emission region LEA may be formed by patterning the semiconductor layers using photolithography and etching processes using a conventional technique. In this specification, the light emission region LEA refers to a region surrounded by edges of a lower multi-quantum well structure 102 or an upper multi-quantum well structure 103. In an exemplary embodiment, the light emission region LEA may be surrounded by a non-emission region NLEA. The non-emission region NLEA is a region that does not emit light and refers to a region in which the lower multi-quantum well structure 102 and the upper multi-quantum well structure 103 do not exist, but a first conductivity type semiconductor layer 101 may exist in the non-emission region NLEA. In the illustrated exemplary embodiment, the light emitting device 10 includes a single light emission region LEA, as shown in FIG. 3. A region that does not emit light, such as a via hole, may be included in the light emission region LEA, but in this specification, an entire region surrounded by edges of the lower multi-quantum well structure 102 or the upper multi-quantum well structure 103 is defined as the light emission region LEA.

The first electrode pad 111 is electrically connected to the first conductivity type semiconductor layer 101, and the second electrode pad 113 is electrically connected to a second conductivity type semiconductor layer 104. The first conductivity type semiconductor layer 101 may be exposed through the second conductivity type semiconductor layer 104 and the multi-quantum well regions 102 and 103 such that the first electrode pad 111 is connected to the first conductivity type semiconductor layer 101. Although not shown, an ohmic layer may be formed on the second conductivity type semiconductor layer 104.

In an exemplary embodiment, the first electrode pad 111 and the second electrode pad 113 may be disposed on the light emission region LEA. However, the inventive concepts are not limited thereto, and the first electrode pad 111 and the second electrode pad 113 may be disposed on the non-emission region NLEA. For example, the first electrode pad 111 may be disposed on the first conductivity type semiconductor layer 101 in the light emission region LEA or the non-emission region NLEA, and the second electrode pad 113 may be disposed on the second conductivity type semiconductor layer 104 in the light emission region LEA.

In the illustrated exemplary embodiment, the light emitting device 10 emits light by injecting a current through the first electrode pad 111 and the second electrode pad 113. In FIG. 3, the light emission region LEA has an area of approximately X·Y, and thus, when a current I is applied, it is operated under a current density J of I/(X·Y). The light emitting device 10 emits light having a first wavelength and a second wavelength. An intensity of light of the first wavelength and an intensity of light of the second wavelength may be relatively changed according to the current density. As the current density increases, the intensity of light having the first wavelength shorter than the second wavelength increases. Light emitted from the light emitting device 10 includes more blue light as the current density increases, and thus, color coordinates of light emitted from the light emitting device 10 moves to a direction in which both x values and y values in a CIE color coordinate graph become smaller.

Figure 4A:
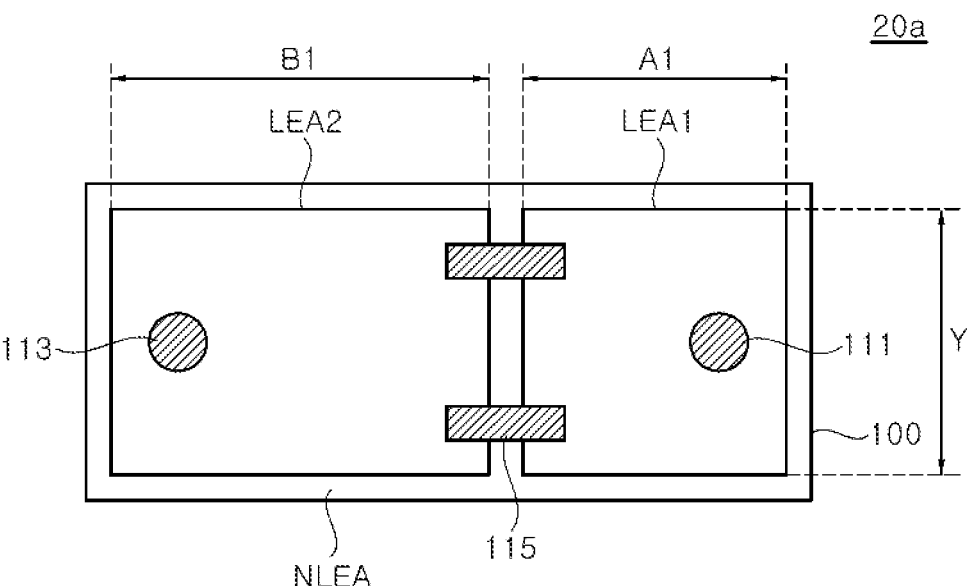
FIG. 4A is a schematic plan view illustrating a light emitting device having two light emission regions according to an exemplary embodiment of the present disclosure.

FIG. 4A is a schematic plan view illustrating a light emitting device having two light emission regions according to an exemplary embodiment of the present disclosure.

Referring to FIG. 4A, a light emitting device 20a is substantially similar to the light emitting device 10 described with reference to FIG. 3, except that it includes two light emission regions LEA1 and LEA2, and further includes a conductive connector 115 for connecting the light emission regions LEA1 and LEA2. An ohmic layer may be formed on a second conductivity type semiconductor layer 104 of each of the light emission regions LEA1 and LEA2. Meanwhile, each of the light emission regions LEA1 and LEA2 may be surrounded by a non-emission region NLEA.

In the illustrated exemplary embodiment, a first light emission region LEA1 has an area different from that of a second light emission region LEA2. As shown in FIG. 4A, the first light emission region LEA1 may have a smaller area than that of the second light emission region LEA2. That is, A1 may be smaller than B1. Conversely, the first light emission region LEA1 may have a larger area than that of the second light emission region LEA2. Hereinafter, it will be described that the first light emission region LEA1 has the smaller area than that the second light emission region LEA2, but it should be noted that the opposite may be possible.

In the exemplary embodiment shown in FIG. 4A, the area of the second light emission region LEA2 exceeds about 1.2 times of the area of the first light emission region LEA1. For example, the area of the second light emission region LEA2 is about 1.2 times or more, specifically, about 1.5 times or more, further, about 2 times or more, furthermore, about 3 times or more of the area of the first light emission region LEA1. An area ratio of the second light emission region LEA2 to the first light emission region LEA1 is not particularly limited, but may be, for example, 5 times or less.

A first electrode pad 111 may be electrically connected to a first conductivity type semiconductor layer 101 of the first light emission region LEA1, and a second electrode pad 113 may be electrically connected to the second conductivity type semiconductor layer 104 of the second light emitting region LEA2. The first electrode pad 111 may be disposed in the first light emission region LEA1, without being limited thereto, and may be disposed in the non-emission region NLEA around the first light emission region LEA1. The second electrode pad 113 may be disposed in the second light emission region LEA2, without being limited thereto, and may be disposed in the non-emission region NLEA around the second light emission region LEA2.

The conductive connector 115 is electrically connected to the first light emission region LEA1, and electrically connected to the second light emission region LEA2. Alternatively, the conductive connector 115 electrically connects the first light emission region LEA1 and the second light emission region LEA2. The conductive connector 115 may connect the first light emission region LEA1 and the second light emission region LEA2 in series. For example, the conductive connector 115 may electrically connect the second conductivity type semiconductor layer 104 of the first light emission region LEA1 to the first conductivity type semiconductor layer 101 of the second light emission region LEA2. As shown in FIG. 4A, a plurality of conductive connectors 115 may connect the first light emission region LEA1 and the second light emission region LEA2 in series. However, the inventive concepts are not limited thereto, and one conductive connector 115 may connect the first light emission region LEA1 and the second light emission region LEA2 in series.

In the illustrated exemplary embodiment, the first light emission region LEA1 has an area of, for example, approximately A1·Y, and the second light emission region LEA2 has an area of approximately B1·Y. When a current I is applied to the light emitting device 20a in which the first light emission region LEA1 and the second light emission region LEA2 are connected in series, a current density J1 applied to the first light emission region LEA1 will be I/(A1·Y), and a current density J2 applied to the second light emission region LEA2 will be I/(B1·Y). For example, when B1 is greater than A1, the current density J1 applied to the first light emission region LEA1 is greater than the current density J2 applied to the second light emission region LEA2.

According to the illustrated exemplary embodiment, by employing the light emitting device 20a having the plurality of light emission regions LEA1 and LEA2 having different areas from each other, the light emission regions LEA1 and LEA2 may be operated under different current densities. Accordingly, even when a same current is applied, light emitted from the first light emission region LEA1 and the second light emission region LEA2 has different color coordinates from each other. That is, the light emission region LEA1 having the smaller area emits light including more blue light components than the light emission region LEA2 having the larger area. Accordingly, color coordinates of light emitted from the first light emission region LEA1 have smaller x-values and smaller y-values than those of color coordinates of light emitted from the second light emission region LEA2. Lights emitted from the first light emission region LEA1 and the second light emission region LEA2 may have different first and second color coordinates from each other, and mixed light of the light emitted from the first and second light emission regions LEA1 and LEA2 may have a third color coordinate different from the first and second color coordinates.

Alternatively, even when the same current is applied, the first light emission region LEA1 and the second light emission region LEA2 emit light having different peak wavelengths from each other. A desired color coordinate value may be realized by mixing light having different peak wavelengths from each other.

The light emitting device 20a emits a mixture of light emitted from the first light emission region LEA1 and light emitted from the second light emission region LEA2. Accordingly, light emitted from the light emitting device 20a has the color coordinate determined by an intensity and a color coordinate of light emitted from the first light emission region LEA1 and an intensity and a color coordinate of light emitted from the second light emission region LEA2.

The light emitting device 20a having the plurality of light emission regions LEA1 and LEA2 has a characteristic that a change in color coordinates according to a change in current densities is smaller than that of the light emitting device 10 having a single light emission region LEA. This will be described again later with reference to FIG. 7.

Figure 4B:
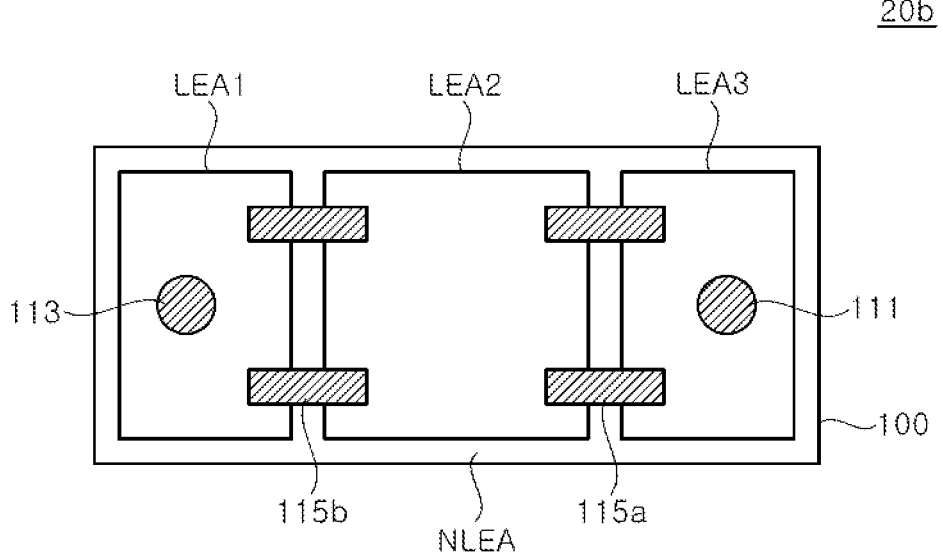
FIG. 4B is a schematic plan view illustrating a light emitting device having three light emission regions according to an exemplary embodiment of the present disclosure.

FIG. 4B is a schematic plan view illustrating a light emitting device 20b having three light emission regions LEA1, LEA2, and LEA3 according to an exemplary embodiment of the present disclosure.

Referring to FIG. 4B, the light emitting device 20b according to the illustrated exemplary embodiment is substantially similar to the light emitting device 20a described with reference to FIG. 4A, except that it includes three light emission regions LEA1, LEA2, and LEA3. Each of the light emission regions LEA1, LEA2, and LEA3 may be surrounded by a non-emission region NLEA.

The light emission regions LEA1, LEA2, and LEA3 may be connected in series with one another by conductive connectors 115a and 115b. A first electrode pad 111 may be electrically connected to a first conductivity type semiconductor layer 101 of a first light emission region LEA1, and a second electrode pad 113 may be electrically connected to a second conductivity type semiconductor layer 104 of a third light emission region LEA3. The conductive connector 115a may connect the first light emission region LEA1 and a second light emission region LEA2 in series, and the conductive connector 115b may connect the second light emission region LEA2 and the third light emission region LEA3 in series.

The three light emission regions LEA1, LEA2, and LEA3 have different areas from one another. Accordingly, when a current I is applied to the light emitting device 20b, each of the light emission regions LEA1, LEA2, and LEA3 is operated under different current densities from one another. The light emitting device 20b emits a mixture of light emitted from the first through third light emission regions LEA1, LEA2, and LEA3. Accordingly, light emitted from the light emitting device 20b has a color coordinate determined by an intensity and a color coordinate of light emitted from the first light emission region LEA1, an intensity and a color coordinate of light emitted from the second light emission region LEA2, and an intensity and a color coordinate of light emitted from the third light emission region LEA3. That is, a first color coordinate of light emitted from the first light emission region LEA1, a second color coordinate of light emitted from the second light emission region LEA2, and a third color coordinate of light emitted from the third light emission region LEA3 are different from one another. and a fourth color coordinate value may be realized through a combination of these color coordinates.

Although the light emitting devices 20a and 20b having two light emission regions and three light emission regions, respectively, have been described in the exemplary embodiments of FIG. 4A and FIG. 4B above, the light emitting device of the present disclosure is not limited to include a specific number of light emission regions, and it may include four or more light emission regions. In addition, although it has been illustrated and described that the light emission regions LEA, LEA1, LEA2, and LEA3 have a same Y length in the previous embodiments, the inventive concepts are not limited thereto. The light emission regions LEA1 and LEA2 may have different Y lengths so as to have different areas.

The color coordinates of light emitted from the light emitting devices 10, 20a, and 20b according to the illustrated exemplary embodiment change according to a change in current values. The light emitting devices 20a and 20b having the plurality of light emission regions may realize a high current density even when a relatively low current is applied compared to the light emitting device 10 having the single light emission region. For example, compared to the light emitting device 10 having the single light emission region LEA, the light emitting device 20a or 20b having the plurality of light emission regions LEA1 and LEA2 may implement white light equivalent to that of the light emitting device 10 with a lower current value.

Figure 5:
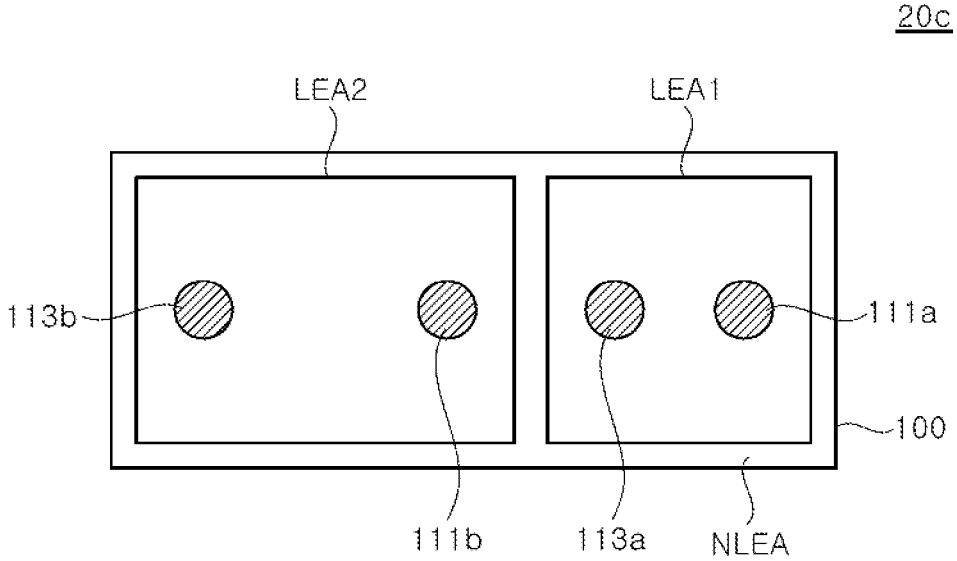
FIG. 5 is a schematic cross-sectional view illustrating a light emitting device according to another exemplary embodiment.

FIG. 5 is a schematic plan view illustrating a light emitting device 20c according to another exemplary embodiment.

Referring to FIG. 5, the light emitting device 20c according to the illustrated exemplary embodiment is substantially similar to the light emitting device 20a described with reference to FIG. 4A, except that first electrode pads 111a and 111b and second electrode pads 113a and 113b are disposed on a first emission region LEA1 and a second emission region LEA2, respectively.

The light emission regions LEA1 and LEA2 may be connected to each other in series, but the inventive concepts are not limited thereto. The light emission regions LEA1 and LEA2 may be connected in parallel. To this end, the first and second electrode pads 111a and 113a may be disposed on the first emission region LEA1, and the first and second electrode pads 111b and 113b may be disposed on the second emission region LEA2.

The first light emission region LEA1 and the second light emission region LEA2 are operated under different current densities from each other. To this end, the first light emission region LEA1 and the second light emission region LEA2 may have different areas from each other, or currents applied to the first light emission region LEA1 and the second light emission region LEA2 may be different.

In the illustrated exemplary embodiment, the first light emission region LEA1 and the second light emission region LEA1 may be driven independently. For example, the current applied to the first light emission region LEA1 and the current applied to the second light emission region LEA2 may be supplied through different supply devices from each other. Since they can be driven independently, color coordinates can be adjusted, and color temperatures may be further adjusted.

In the illustrated exemplary embodiment, the first electrode pads 111a and 111b may be electrically spaced apart from each other, and the second electrode pads 113a and 113b may be electrically spaced apart from each other. However, the inventive concepts are not limited thereto, and the first electrode pads 111a and 111b or the second electrode pads 113a and 113b may be electrically connected to each other to form a common electrode. When the first electrode pads 111a and 111b form the common electrode, the second electrode pads 113a and 113b are electrically spaced apart from each other, and the light emitting regions LEA1 and LEA2 may be individually driven using the second electrode pads 113a and 113b. When the second electrode pads 113a and 113b form the common electrode, the first electrode pads 111a and 111b are electrically spaced apart from each other, and the light emitting regions LEA1 and LEA2 may be individually driven using the first electrode pads 111a and 111b.

A plurality of light emission regions LEA1 and LEA2 may be formed on a same growth substrate 100 so as to share the substrate 100, but the inventive concepts are not limited thereto. For example, each of the light emission regions LEA1 and LEA2 may independently include the substrate 100, and thus, each of the light emission regions LEA1 and LEA2 may be disposed on the respective substrates 100 spaced apart from each other.

Figure 6:
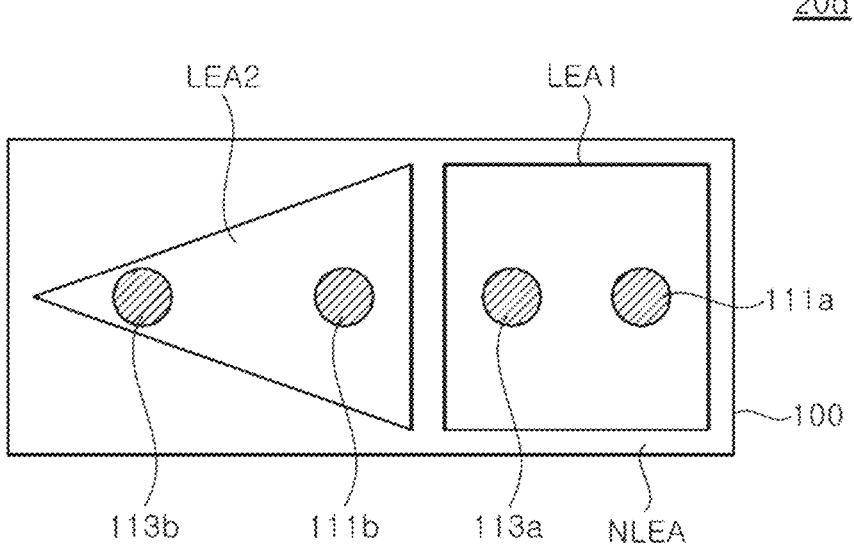
FIG. 6 is a schematic cross-sectional view illustrating a light emitting device according to another exemplary embodiment.

FIG. 6 is a schematic plan view illustrating a light emitting device 20d according to another exemplary embodiment.

Referring to FIG. 6, the light emitting device 20d according to the illustrated exemplary embodiment is substantially similar to the light emitting device 20c described with reference to FIG. 5, except that a shape of a second light emission region LEA2 is different. A first light emission region LEA1 and the second light emission region LEA2 may have different shapes, may have different areas, or may have asymmetric shapes. In another exemplary embodiment, the first light emission region LEA1 and the second light emission region LEA2 may have different numbers of corners. In the exemplary embodiment of FIG. 5, the first light emission region LEA1 and the second light emission region LEA2 have been illustrated and described as having a substantially rectangular shape, but in the illustrated exemplary embodiment, the second light emission region LEA2 has a substantially triangular shape. In the illustrated exemplary embodiment, although the second light emission region LEA2 has been illustrated as having the triangular shape, it is not limited to the triangular shape, and may have other shapes such as a circle, a pentagon, and a hexagon. Furthermore, the first light emission region LEA1 may also have a shape other than a rectangle.

By setting shapes or light emission areas of the first light emission region LEA1 and the second light emission region LEA2 to be different from each other, a current density of the first light emission region LEA1 and a current density of the second light emission region LEA2 may be made to be different from each other, and thus, light of different wavelengths may be effectively mixed and emitted.

FIG. 7 is a CIE graph illustrating changes in color coordinates according to current densities of a light emitting device having a single light emission region and a light emitting device having a plurality of light emission regions.

In the graph, 1LEA represents changes in color coordinates of light emitted from the light emitting device as currents applied to the light emitting device having the single light emission region are increased from 4 mA to 30 mA. Meanwhile, 2LEA represents changes in color coordinates of light emitted from the light emitting device as currents applied from the light emitting device having two light emission regions are increased from 2 mA to 15 mA. The light emitting device having two light emission regions includes two light emission regions having different areas from each other as described with reference to FIG. 4A, and these light emission regions are connected in series. The two light emission regions were formed to have an area ratio of generally 1:2. A total area of the light emitting device having two light emission regions is substantially similar to a total area of the light emitting device having the single light emission region. Accordingly, the current applied to the light emitting device having two light emission regions was ½ of the current applied to the light emitting device having the single light emission region.

Tables 1 and 2 below summarize voltages applied to the light emitting device having the single light emission region and the light emitting device having the plurality of light emission regions, and current densities and color coordinates of light emitted from the light emitting devices according thereto, respectively.

TABLE 1

| Current (mA) | Current density (A/cm²) | x | y |
| --- | --- | --- | --- |
| 4 | 6.1 | 0.31 | 0.619 |
| 5 | 7.6 | 0.293 | 0.588 |
| 6 | 9.1 | 0.277 | 0.555 |
| 7 | 10.6 | 0.263 | 0.522 |
| 8 | 12.1 | 0.251 | 0.493 |
| 9 | 13.6 | 0.241 | 0.468 |
| 10 | 15.2 | 0.233 | 0.447 |
| 11 | 16.7 | 0.226 | 0.429 |
| 12 | 18.2 | 0.22 | 0.413 |
| 13 | 19.7 | 0.215 | 0.4 |
| 14 | 21.2 | 0.211 | 0.388 |
| 15 | 22.7 | 0.207 | 0.378 |
| 16 | 24.2 | 0.204 | 0.369 |
| 17 | 25.8 | 0.201 | 0.361 |
| 18 | 27.3 | 0.199 | 0.354 |
| 19 | 28.8 | 0.196 | 0.348 |
| 20 | 30.3 | 0.194 | 0.342 |
| 21 | 31.8 | 0.193 | 0.338 |
| 22 | 33.3 | 0.191 | 0.333 |
| 23 | 34.8 | 0.19 | 0.329 |
| 23.1 | 35.0 | 0.189 | 0.328 |
| 24 | 36.4 | 0.188 | 0.325 |
| 25 | 37.9 | 0.187 | 0.321 |
| 26 | 39.4 | 0.186 | 0.318 |
| 27 | 40.9 | 0.185 | 0.315 |
| 28 | 42.4 | 0.184 | 0.312 |
| 29 | 43.9 | 0.183 | 0.31 |
| 30 | 45.5 | 0.182 | 0.307 |

TABLE 2

| Current (mA) | Current density (A/cm²) | x | y |
| --- | --- | --- | --- |
| 2 | | 0.216 | 0.289 |
| 3 | | 0.203 | 0.246 |
| 4 | | 0.197 | 0.224 |
| 5 | | 0.192 | 0.209 |
| 6 | | 0.189 | 0.200 |
| 7 | | 0.187 | 0.193 |
| 8 | | 0.185 | 0.188 |

TABLE 2-continued

| Current (mA) | Current density (A/cm²) | x | y |
| --- | --- | --- | --- |
| 9 | | 0.184 | 0.184 |
| 10 | | 0.183 | 0.180 |
| 15 | | 0.18 | 0.169 |

In Table 1 and FIG. 2, regions in which the currents applied to the light emitting device having the single light emission region and the light emitting device having the plurality of light emission regions are same are indicated in bold. Comparing changes in CIE coordinates, in a case of the light emitting device having the single light emission region, as the currents changed from 4 mA to 15 mA, x coordinates decreased from 0.31 to 0.207, and y coordinates decreased from 0.619 to 0.378. An amount of change of the x-coordinates was Δ x=0.103, and an amount of change of the y-coordinates was Δy=0.241. Meanwhile, in a case of the light emitting device having the plurality of light emission regions, as the applied currents 116 changed from 4 mA to 15 mA, x coordinates decreased from 0.197 to 0.18, y coordinates decreased from 0.224 to 0.169, and an amount of change of the x coordinates was Δx=0.017, and an amount of change of the y-coordinates was Δy=0.055. That is, in the light emitting device, as a current value increases, the x and y coordinate values change in a decreasing direction, and the applied current value and the x and y values may be inversely proportional to each other. The light emitting device having the plurality of light emission regions has a smaller change in the x-coordinates and the y-coordinates according to the same current change than the light emitting device having the single light emission region.

Furthermore, as it can be seen from FIG. 7, the amount of change of the color coordinates according to the change from 2 mA to 15 mA is also relatively small in the light emitting device having the plurality of light emission regions, compared to the amount of change of the color coordinates according to the change from 4 mA to 30 mA in the light emitting device having the single light emission region. Therefore, since the light emitting device having the plurality of light emission regions that have different areas from one another has a reduced amount of change in CIE color coordinates compared to that of the light emitting device having the single light emission region, the change in color coordinates caused by the change in currents or the change in current densities may be minimized. and thus, a color uniformity of the light emitting device may be improved.

In the light emitting diodes described with reference to FIG. 1 and FIG. 2, the intensity of light having the relatively short first wavelength increases as the current density increases. Accordingly, when the same current is applied to the light emitting device having the single light emission region and the light emitting device having the plurality of light emission regions under a condition having a similar total area, the current density applied to each of the light emission regions in the light emitting device having the plurality of light emission regions becomes higher than the current density applied to the single light emission region. For example, assuming that an area of the single light emission region is (A+B) and areas of the light emission regions of the light emitting device having the plurality of light emission regions are A and B, respectively, when a current C is applied thereto, a current density C/(A+B) is applied to the light emitting device having the single light emission region, and current densities of C/A and C/B are applied to respective light emitting regions of the light emitting device having the plurality of light emission regions. The current densities of C/A and C/B are greater than C/(A+B), and thus, the color coordinates of light emitted from each of the plurality of light emission regions will have smaller x and y values compared to those of the light emitting device having the single light emission region.

Furthermore, in the light emitting device having the plurality of light emission regions, since the areas of each light emission region are different from one another, the current densities applied to each light emission region are also different from one another, thereby reducing the amount of change in color coordinates. Furthermore, even in an environment in which the light emitting device is driven by supplying a relatively low current, white light may be easily implemented without a phosphor by employing the plurality of light emission regions. Moreover, it can be driven under a low current, so that heat generated from the light emitting device may be reduced, and thus, reliability of the light emitting device may be improved. Since heat generated from the light emitting device may be reduced, deterioration of the phosphor may be remarkably reduced even when the phosphor is formed on the light emitting device for color conversion.

Figure 8A:
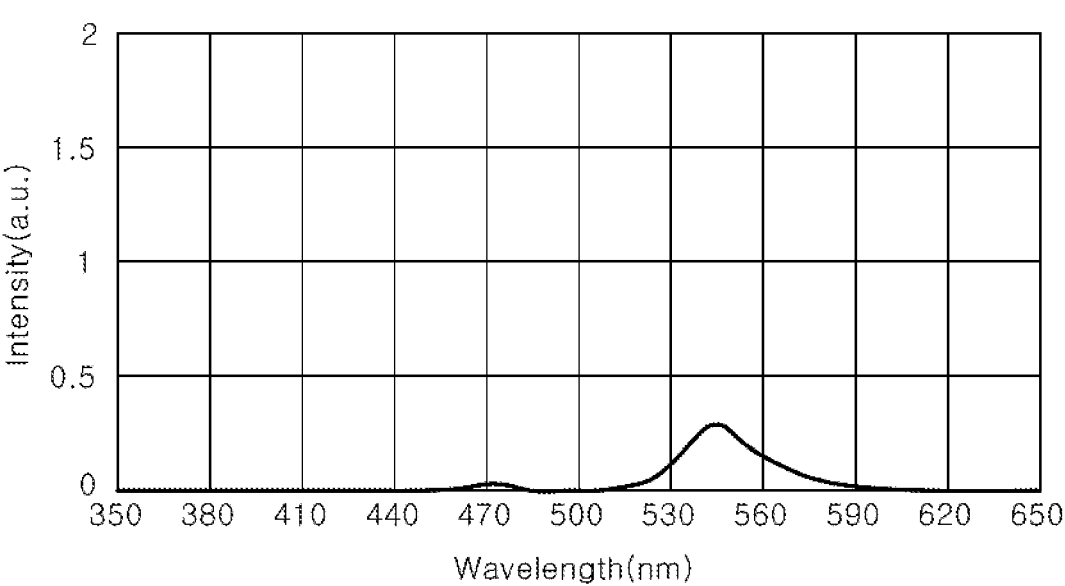
FIG. 8A and FIG. 8B are graphs showing emission spectrums according to current densities of a light emitting device having a single light emission region.
Figure 8B:
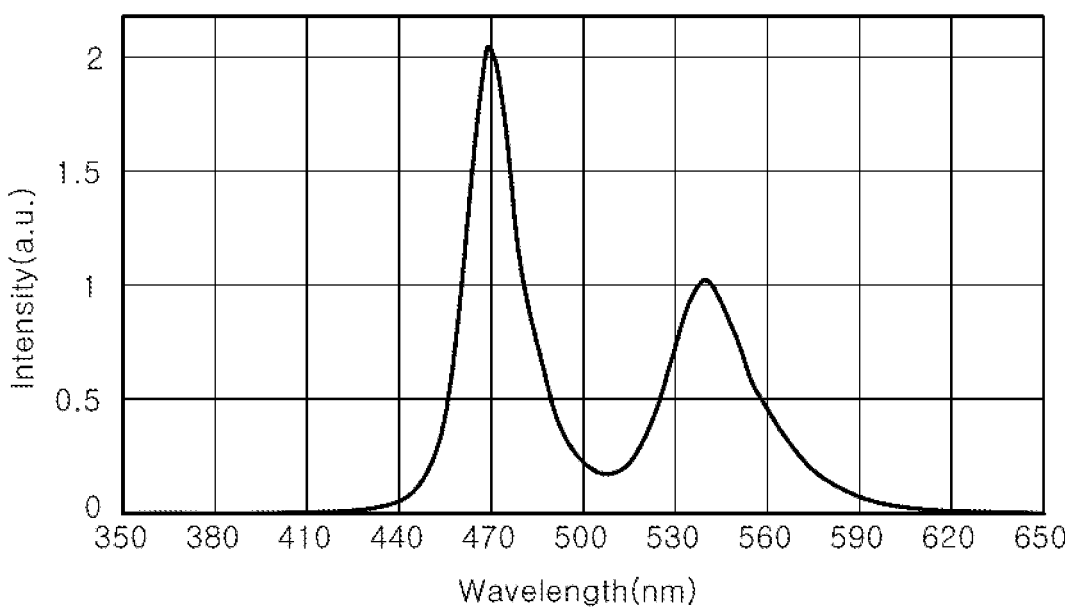
Figure 8C:
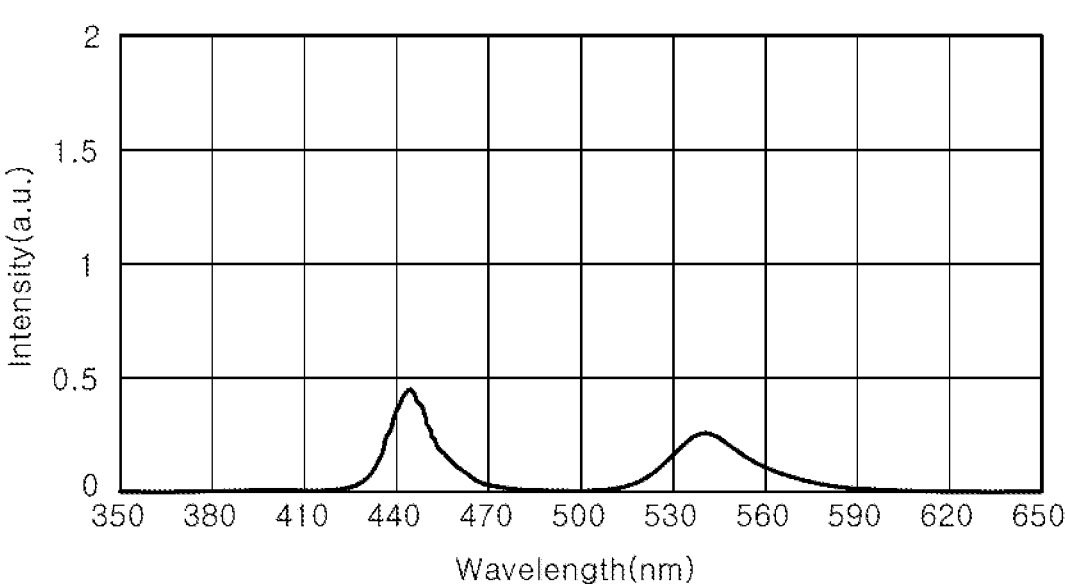
FIG. 8C and FIG. 8D are graphs showing emission spectrums according to current densities of a light emitting device having a plurality of light emission regions.
Figure 8D:
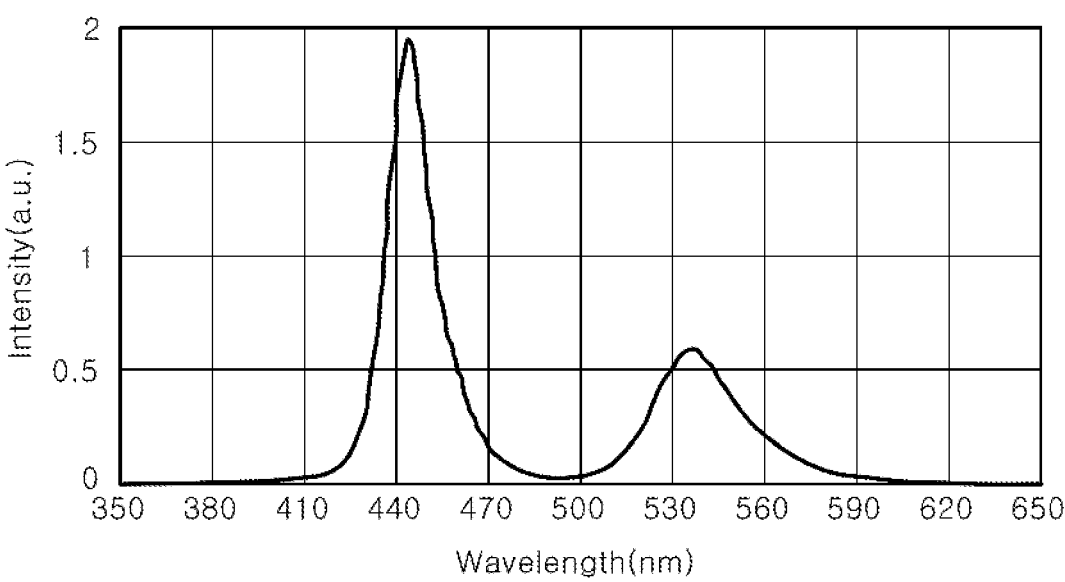

FIG. 8A and FIG. 8B are graphs showing emission spectrums according to current densities of a light emitting device having a single light emission region, and FIG. 8C and FIG. 8D are graphs showing emission spectrums according to current densities of a light emitting device having a plurality of light emission regions (here, two light emission regions). FIG. 8A and FIG. 8B show emission spectrums at current densities of about 5.8 A/cm$^2$ and about 35 A/cm$^2$ for the light emitting device having the single light emission region. Here, the above current density for the light emitting device having the single light emission region is calculated with respect to a substrate area, which will be smaller than a current density actually applied to the light emission region. Meanwhile, the light emitting device having the plurality of light emission regions has a same chip area as that of the light emitting device having the single light emission region, that is, a same substrate area. FIG. 8C and FIG. 8D show emission spectrums obtained by applying ½ of the current applied to the light emitting device having the single light emission region of FIG. 8A and FIG. 8B to the light emitting device having the plurality of light emission regions, respectively.

Referring to FIG. 8A and FIG. 8B, in a case of the light emitting device having the single light emission region, at the current density of about 5.8 A/cm$^2$, light having a relatively short first peak wavelength exhibits relatively weaker intensity than light having a relatively long second peak wavelength. On the contrary, at a high current density of about 35 A/cm$^2$, light having the relatively short first peak wavelength exhibits a relatively stronger intensity than light having the relatively long second peak wavelength.

Meanwhile, as shown in FIG. 8C, in a case of the light emitting device having the plurality of light emission regions, even at a relatively low current density, light having a relatively short first peak wavelength exhibits a relatively stronger intensity than light having a relatively long second peak wavelength. In addition, as shown in FIG. 8D, at a relatively high current density, light having the relatively short first peak wavelength exhibits a relatively stronger intensity than light having the relatively long second peak wavelength.

Comparing FIG. 8B and FIG. 8D, under the relatively high current density, the emission spectrums of the light emitting device having the single light emission region and the light emitting device having the plurality of light emission regions have two peaks, and have a first peak in a blue wavelength range having the relatively short wavelength and a second peak in a yellow wavelength range having the relatively long wavelength. In addition, a height of the first peak is formed to be higher than that of the second peak. Moreover, it can be seen that a ratio of an intensity of the first peak to an intensity of the second peak is higher in the light emitting device having the plurality of light emission regions than in the light emitting device having the single light emission region.

Meanwhile, when a current density of about 3.5 A/cm$^2$, which is about 10% smaller than the current density of FIG. 8B, is applied, as shown in FIG. 8A, the light emitting device having the single light emission region emits light having the second peak higher than the first peak. On the contrary, as shown in FIG. 8C, in the light emitting device having the plurality of light emission regions, the intensity of the first peak is higher than that of the second peak even at a relatively low current density. That is, since the current density formed in each light emission region is high, a spectrum generated at a high current can be realized even at a low current. A shape of the emission spectrum of the present disclosure is not limited to that described herein, and may be changed according to a composition, a thickness, and a target wavelength of an active region.

Referring to FIG. 8D, it can be seen that the peak intensity at the relatively short wavelength is twice or more higher than the peak intensity at the long wavelength. Furthermore, it can be seen that a full width at half maximum (FWHM) of an emission peak at the relatively shorter wavelength is smaller than a full width at half maximum (FWHM) of an emission peak at the longer wavelength.

Figure 9A:
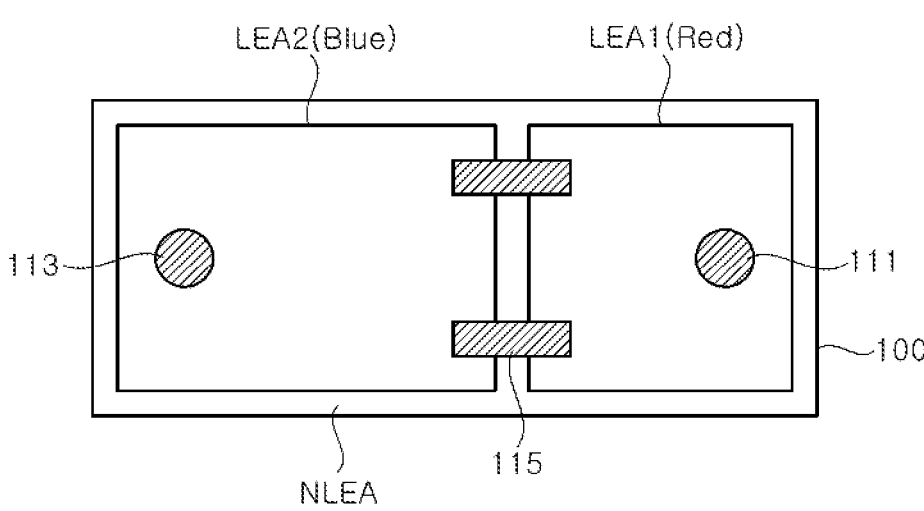
FIG. 9A and FIG. 9B are schematic plan views illustrating various color combinations of a light emitting device according to exemplary embodiments of the present disclosure.
Figure 9B:
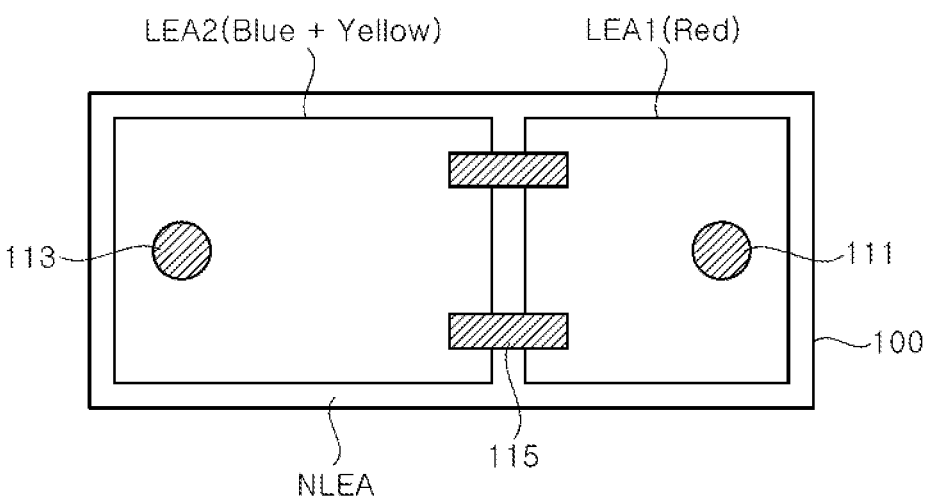

FIG. 9A and FIG. 9B are schematic plan views illustrating various color combinations of a light emitting device according to exemplary embodiments of the present disclosure.

The light emitting device according to the illustrated exemplary embodiment is substantially similar to the light emitting device 20a described with reference to FIG. 4A. Herein, light emission regions LEA1 and LEA2 emitting light of a specific color will be described in more detail. Since current densities applied to the light emission regions LEA1 and LEA2 are different from each other, the light emission regions LEA1 and LEA2 emit light having different color coordinates. On a CIE color coordinate, one light emission region may emit light closer to pure blue, and the other light emission region may emit light closer to pure red or pure green. For example, the light emission regions LEA1 and LEA2 may be formed to selectively emit light of various colors such as blue, red, yellow, green, and others, respectively. For example, as shown in FIG. 9A, the first light emission region LEA1 may emit red light, the second light emission region LEA2 may emit blue light, and high-purity white light may be implemented by mixing light emitted from the first light emission region LEA1 and the second light emission region LEA2. Although it is described that the first light emission region LEA1 emits red light and the second light emission region LEA2 emits blue light, the opposite may be applied.

Also, as shown in FIG. 9B, the first light emission region LEA1 may emit red light, the second light emission region LEA2 may emit a mixture of blue and yellow light, and high-purity white light may be implemented by mixing light emitted from the first light emission region LEA1 and the second light emission region LEA2. The first light emission region LEA1 may emit a mixture of blue and yellow light, and the second light emission region LEA2 may emit red light. To adjust CIE color coordinates of white light, areas of each of the light emission regions LEA1 and LEA2 may be adjusted, and a peak wavelength of light emitted from each of the light emission regions may be adjusted. By changing current densities applied to each of the light emission regions LEA1 and LEA2, the CIE color coordinates of the mixed light of light emitted from the light emission regions LEA1 and LEA2 may be adjusted, and thus, light having desired CIE color coordinates may be implemented.

Figure 10A:
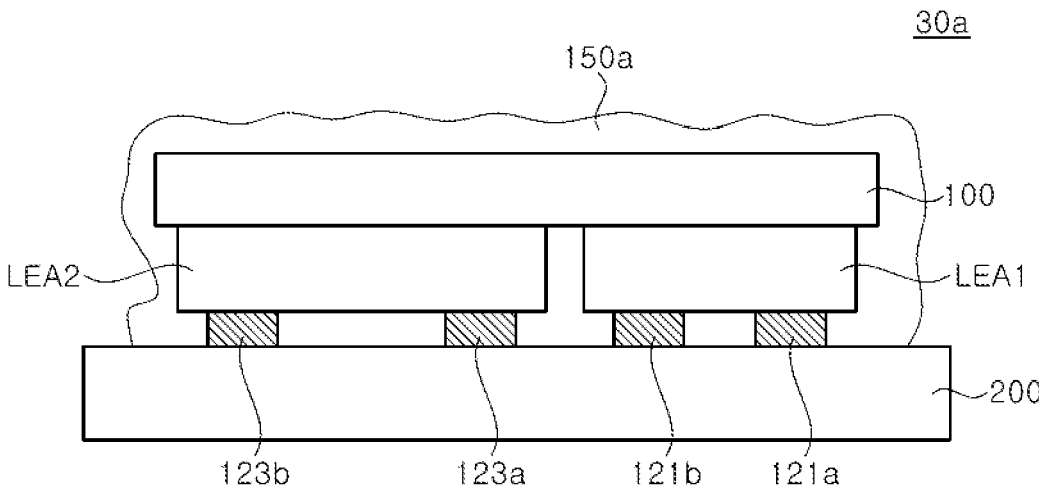
FIG. 10A, FIG. 10B, and FIG. 10C are schematic cross-sectional views illustrating light emitting modules including a wavelength conversion material according to exemplary embodiments of the present disclosure.
Figure 10B:
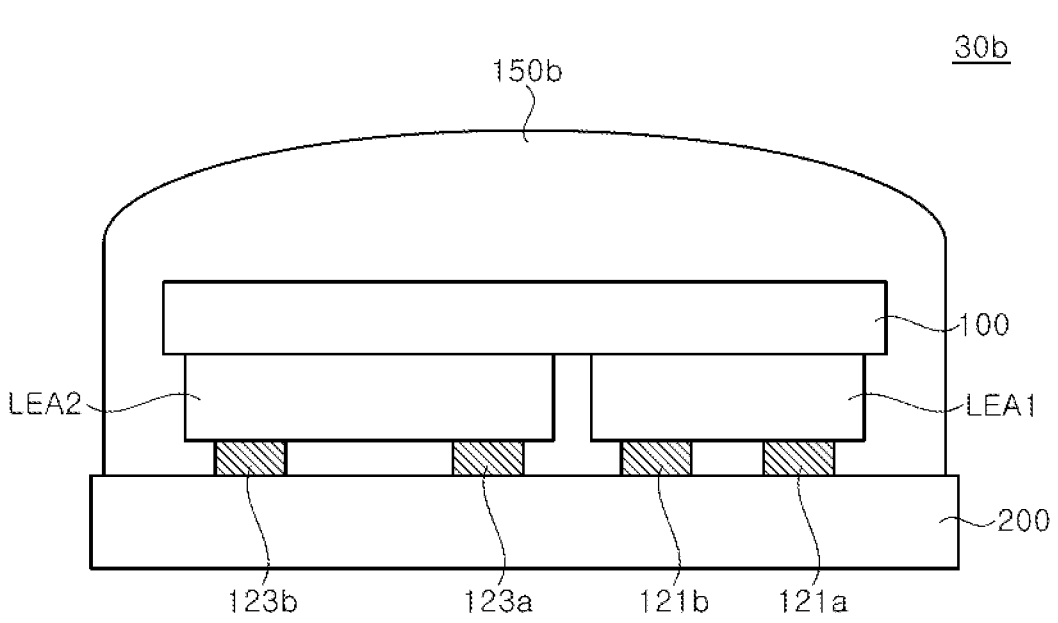
Figure 10C:
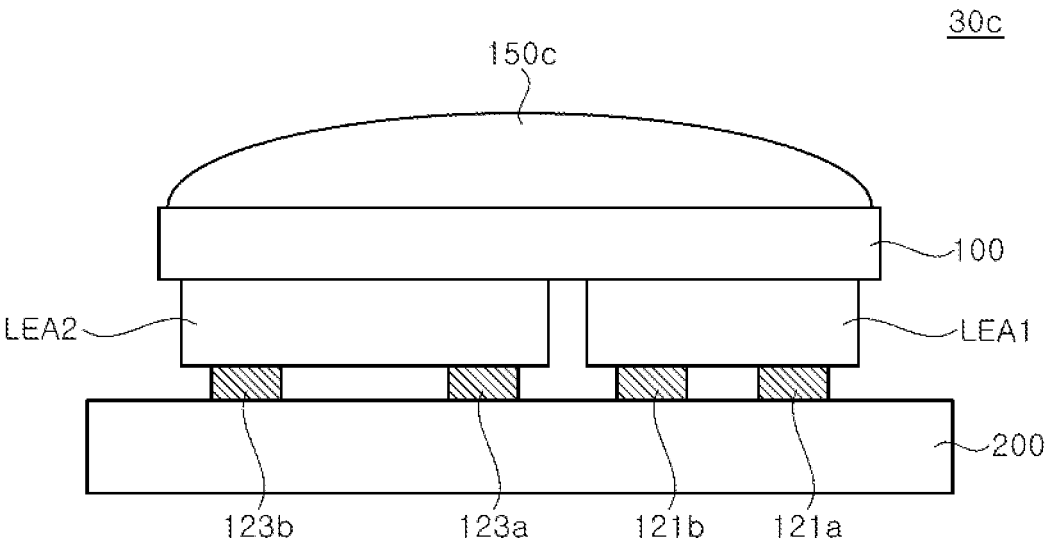

FIG. 10A, FIG. 10B, and FIG. 10C are schematic cross-sectional views illustrating light emitting modules 30a, 30b, and 30c including a wavelength conversion material according to exemplary embodiments of the present disclosure.

Referring to FIG. 10A, the light emitting module 30a may include a light emitting device including a substrate 100 and light emission regions LEA1 and LEA2, a circuit board 200, bonding portions 121a, 121b, 123a, and 123b, and a wavelength converter 150a.

The light emitting device may be, for example, the light emitting device 20c described with reference to FIG. 5, without being limited thereto, and may be the light emitting device 20a, 20b, or 20d described with reference to FIG. 4A, FIG. 4B, or FIG. 6.

The circuit board 200 has a circuit for supplying power to the light emitting device. The circuit board 200 may include a passive circuit and/or active circuit. The bonding portions 121a, 121b, 123a, and 123b electrically connect the light emitting device and the circuit board, and bond the light emitting device on the circuit board 200. In the illustrated exemplary embodiment, the light emission regions LEA1 and LEA2 are illustrated to be bonded to the circuit board 200 through two bonding portions, respectively, but the inventive concepts are not limited thereto. For example, when the light emission regions LEA1 and LEA2 are connected in series through a conductive connector (e.g., 115 in FIG. 4A), the light emission regions LEA1 and LEA2 may be bonded to the circuit board 200 through one bonding portion, respectively. In another exemplary embodiment, one of the bonding portions 121a and 121b and one of the bonding portions 123a and 123b may be a dummy that bonds the light emitting device and the circuit board 200 but does not electrically connect them. In another exemplary embodiment, a conductive connector (e.g., 115 of FIG. 4A) may be electrically connected to each of the light emission regions LEA1 and LEA2 to be connected in parallel.

The wavelength converter 150a includes a wavelength conversion material that converts light emitted from the light emission regions LEA1 and LEA2 into light of a longer wavelength. Examples of the wavelength conversion material include CASN, s-CASN, KSF, KWF, CaS, QD (Quantum Dot), and the like.

The wavelength converter 150a may be formed by using a spray, and as shown in FIG. 10A, a surface thereof may have a roughened shape. Since the wavelength converter 150a has a non-uniform thickness or has the roughened surface, light emitted through the wavelength converter 150a may be dispersed at a wide angle. The wavelength converter 150a may be formed so as to cover side surfaces of the light emission regions LEA1 and LEA2 and a light exiting surface. In addition, a portion of the wavelength converter 150a formed on the side surface and a portion of the wavelength converter 150a formed on the light exiting surface may have different thicknesses from each other.

According to the illustrated exemplary embodiment, white light having an improved color rendering may be emitted by adding the wavelength converter 150a that emits light of a longer wavelength than light emitted from the light emission regions LEA1 and LEA2. In particular, a color temperature of white light may be lowered by adding a component in a red region.

Referring to FIG. 10B, the light emitting module 30b according to the illustrated exemplary embodiment is similar to the light emitting module 30a described with reference to FIG. 10A, except that a wavelength converter 150b is formed using a molding technique. The wavelength converter 150b includes a wavelength conversion material dispersed in a resin. The wavelength converter 150b may be formed on a circuit board 200 so as to cover a light emitting device. The wavelength converter 150b may cover side surfaces and an upper surface of the light emitting device. Furthermore, a portion of the wavelength converter 150b may also be disposed between the light emitting device and the circuit board 200. The wavelength converter 150b may be formed so as to cover side surfaces of the light emission regions LEA1 and LEA2 and a light exiting surface. In addition, a portion of the wavelength converter 150b formed on the side surface and a portion of the wavelength converter 150b formed on the light exiting surface may have different thicknesses from each other. An upper surface of the wavelength converter 150b may be formed as a curved surface, and may have an asymmetric shape with respect to a center portion of each of the light emission regions LEA1 and LEA2.

Referring to FIG. 10C, the light emitting module 30c according to the illustrated exemplary embodiment is similar to the light emitting module 30a described with reference to FIG. 10A, except that a wavelength converter 150c is formed using a dotting technique. The wavelength converter 150c may include a wavelength conversion material dispersed in resin, and may be disposed limitedly on a substrate 100.

A surface of the wavelength converter 150c may form a curved surface and may have an upward convex shape. The wavelength converter 150c may disperse light by controlling the curved shape.

Although the light emitting modules 30a, 30b, and 30c including the wavelength converters 150a, 150b, and 150c have been described in the previous embodiments, the light emitting device may include the wavelength converter without the circuit board 200.

In the previous embodiments, the light emitting device in which the plurality of light emission regions LEA1 and LEA2 having different areas from one another are disposed on one substrate 100 has been described. However, the light emission regions LEA1 and LEA2 having different areas from one another are not necessarily disposed on one substrate 100. That is, the light emission regions LEA1 and LEA2 may be disposed in different light emitting diode chips from each other, respectively. Hereinafter, this will be described with reference to FIG. 11.

Figure 11:
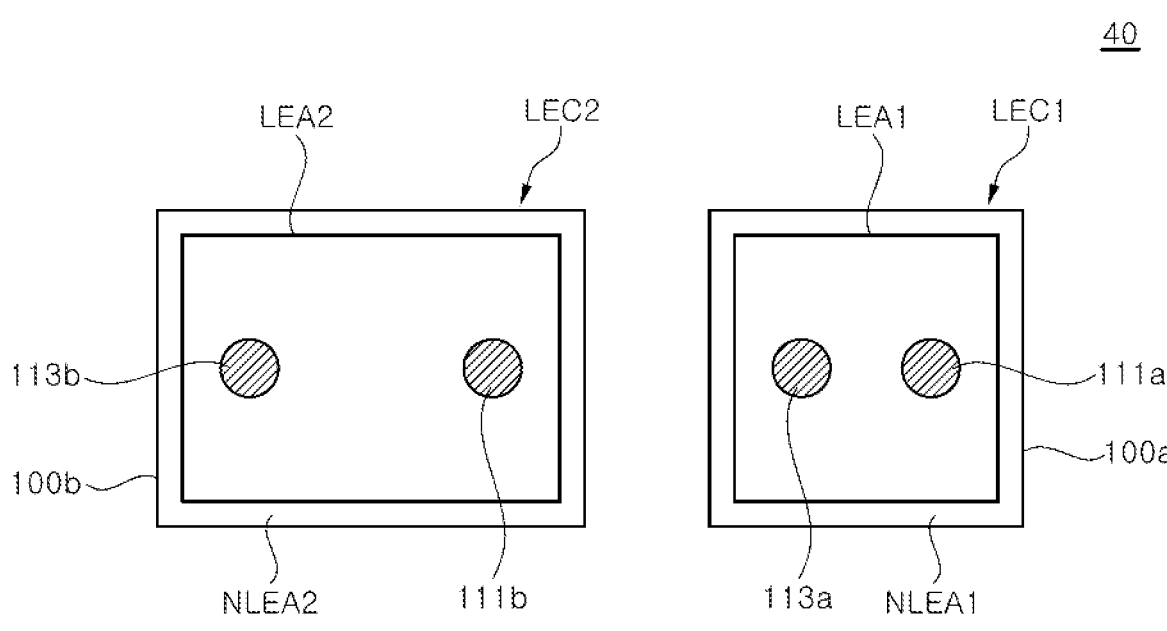
FIG. 11 is a schematic plan view illustrating a light emitting module including a plurality of light emitting chips according to another exemplary embodiment.

FIG. 11 is a schematic plan view illustrating a light emitting module 40 including a plurality of light emitting chips according to another exemplary embodiment.

The light emitting module 40 includes a first light emitting diode chip LEC1 and a second light emitting diode chip LEC2, the first light emitting diode chip LEC1 may include a substrate 100a, a first light emission region LEA1, and electrode pads 111a and 113a, and the second light emitting diode chip LEC2 may include a substrate 100b, a second light emission region LEA2, and electrode pads 111b and 113b.

The substrates 100a and 100b are same as the substrate 100 described with reference to FIG. 4A, and detailed descriptions thereof will be omitted. However, the substrate 100a and the substrate 100b are separated from each other. The substrate 100a may be of a same type as the substrate 100b, without being necessarily limited thereto, and the substrates 100a and 100b may be different types of growth substrates.

The first and second light emission regions LEA1 and LEA2 are disposed on the substrates 100a and 100b, respectively, and may be surrounded by non-emission regions NLEA. The first and second light emission regions LEA1 and LEA2 have different areas from each other.

The light emitting module 40 according to the illustrated exemplary embodiment is substantially similar to the light emitting devices 20a, 20b, 20c, and 20d described with reference to FIG. 4A, FIG. 4B, 5, or FIG. 6, except that the light emission regions LEA1 and LEA2 are disposed on the substrates 100a and 100b spaced apart from each other. The light emitting diode chips LEC1 and LEC2 may be connected in series or in parallel. Current densities applied to the light emission regions LEA1 and LEA2 are different from each other, and thus, the light emitting diode chips LEC1 and LEC2 emit light having different color coordinates from each other. White light may be implemented by mixing light emitted from the light emitting diode chips LEC1 and LEC2.

In the illustrated exemplary embodiment, the light emitting module 40 in which two light emitting diode chips LEC1 and LEC2 form one group has been described, but the inventive concepts are not limited thereto. The light emitting module 40 may include three or more light emitting diode chips, and these light emitting diode chips may include light emission regions having different areas from one another.

Figure 12:
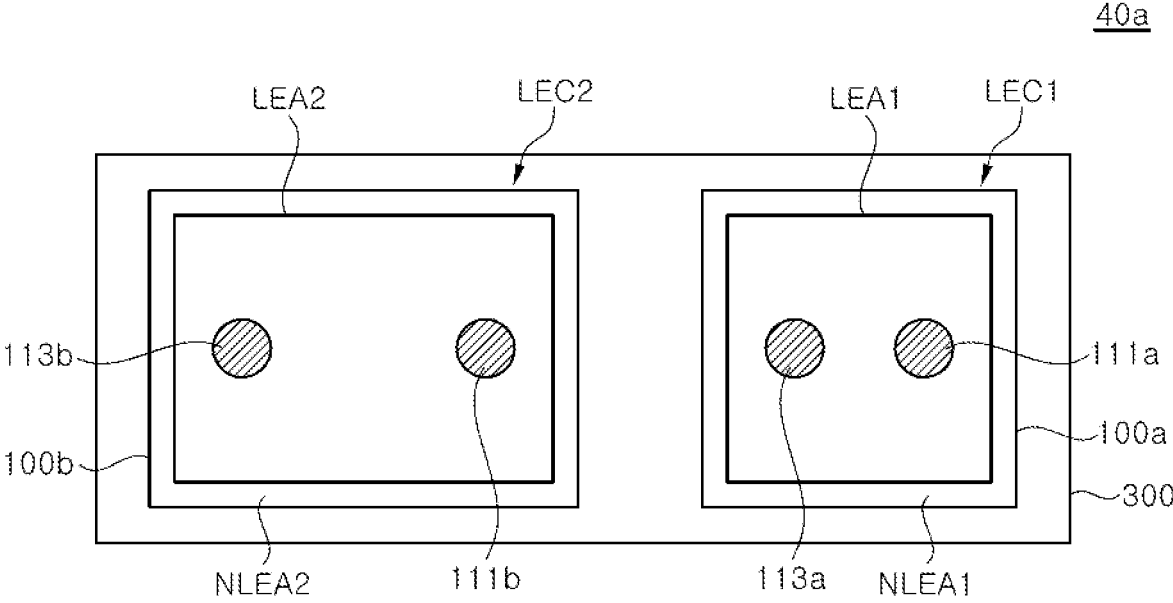
FIG. 12 is a schematic plan view illustrating an example of a light emitting module including a plurality of light emitting diode chips.

The light emitting module 40 may be implemented in various forms depending on a base on which the light emitting diode chips LEC1 and LEC2 are disposed. FIG. 12 is a schematic plan view illustrating an example of a light emitting module 40a including a plurality of light emitting diode chips, and FIG. 13 is a schematic cross-sectional view illustrating another example of a light emitting module 40b including a plurality of light emitting diode chips.

In the light emitting module 40a shown in FIG. 12, light emitting diode chips LEC1 and LEC2 are disposed on a circuit board 300. The circuit board 300 may include a passive and/or active circuit for supplying power to the light emitting diode chips LEC1 and LEC2. The light emitting diode chips LEC1 and LEC2 may be disposed in pairs on the circuit board 300. The light emitting module 40a includes a pair of light emitting diode chips LEC1 and LEC2, but a plurality of pairs of light emitting diode chips LEC1 and LEC2 may be disposed on the circuit board 300.

Figure 13:
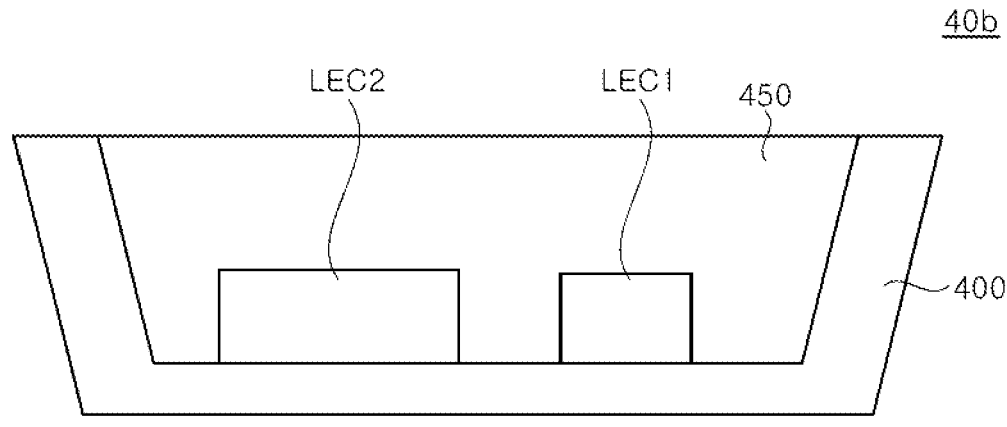
FIG. 13 is a schematic cross-sectional view illustrating another example of a light emitting module including a plurality of light emitting diode chips.

In the light emitting module 40b shown in FIG. 13, light emitting diode chips LEC1 and LEC2 may be disposed in a housing 400. The light emitting module 40b may be provided, for example, in a form of a light emitting diode package. The light emitting diode chips LEC1 and LEC2 may be covered with a molding member 450, and the molding member 450 may be a transparent resin or a resin including a wavelength conversion material.

Figure 14:
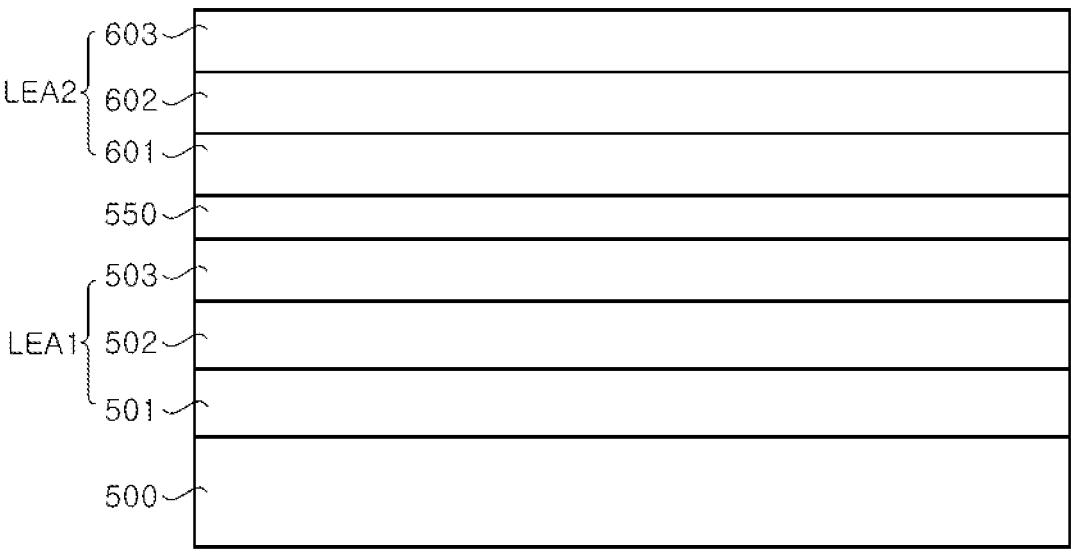
FIG. 14 is a schematic cross-sectional view illustrating a light emitting diode according to another exemplary embodiment.

FIG. 14 is a schematic cross-sectional view illustrating a light emitting diode according to another exemplary embodiment.

Referring to FIG. 14, the light emitting diode according to the illustrated exemplary embodiment has a structure in which two light emission regions LEA1 and LEA2 are vertically stacked on a substrate 500. The substrate 500 may be omitted.

The substrate 500 may be a growth substrate, and may include $Al_2O_3$, AlN, SiC, GaN, and the like. A first light emission region LEA1 includes a first conductivity type semiconductor layer 501 and a second conductivity type semiconductor layer 503, and an emission layer 502 disposed therebetween, and a second light emission region LEA2 includes a first conductivity type semiconductor layer 601 and a second conductivity type semiconductor layer 603, and a light emission layer 602 disposed therebetween.

Each of the light emission regions LEA1 and LEA2 may be formed of a group 3-5 semiconductor layer as described with reference to FIG. 1 and FIG. 2. In addition, In compositions in well layers of the light emission layers 502 and 602 of each of the light emission regions LEA1 and LEA2 may be different from each other. In an exemplary embodiment, the first conductivity type semiconductor layers 501 and 601 may have thicknesses of 2 μm or more, preferably 4 μm or more, and may be n-conductivity type semiconductor layers doped with an n-type impurity. The n-type impurity may be, for example, Si. The light emission layers 502 and 602 may be formed in multiple layers such as InGaN/GaN or InGaN/InAlGaN or InGaN/AlGaN, and may have thicknesses of 1 μm or less, and preferably 200 nm or more. As described with reference to FIG. 1 and FIG. 2, the light emission layers 502 and 602 may include a lower multi-quantum well structure, an upper multi-quantum well structure, and a gap layer disposed therebetween. The second conductivity type semiconductor layers 503 and 603 may include AlGaN or GaN, or may be formed of an AlGaN/GaN multiple layers. The second conductivity type semiconductor layer may be a layer doped with a p-type impurity, and the p-type impurity may be Mg. Thicknesses of the second conductivity type semiconductor layers 503 and 603 may be 1 μm or less, preferably 150 nm or less.

An intermediate layer 550 may be disposed between the emission regions LEA1 and LEA2. The intermediate layer 550 may be a semiconductor layer such as a tunnel junction layer or a bonding layer. When the intermediate layer 550 is the tunnel junction layer, it may function as a bridge electrically connecting respective light emission regions LEA1 and LEA2 formed on upper and lower portions, and may function as a conductive substrate of the second light emission region LEA2. The tunnel junction layer may be formed of Si or Mg-doped GaN or InGaN, and may have a thickness of 0.1 nm or more. For example, the thickness of the tunnel junction layer may be 300 nm or more. The tunnel junction layer may be formed by doping Si or Mg at a high concentration over the second conductivity type semiconductor layer 503 of the first light emission region LEA1, and through this, a tunnel junction may be formed between the second semiconductor layer 503 and an interface of the tunnel junction layer.

$SiO_2$, SiN, or Si-containing layer may be partially patterned and disposed between the second semiconductor layer 503 and the tunnel junction layer. Therefore, a luminous efficiency may be improved through current spread.

When the intermediate layer 550 is the bonding layer, the bonding layer bonds the light emission regions LEA1 and LEA2. The bonding layer may be an insulation layer, without being limited thereto, and may be a conductive layer such as a transparent conductive layer. The second light emission region LEA2 may be grown on a substrate different from the substrate 500 and then bonded to the first light emission region LEA1 through the bonding layer, and the substrate on which the second light emission region LEA2 is grown may be separated from the second light emission region LEA2.

The intermediate layer 550 may have a low light absorption with respect to light emitted from the light emission regions LEA1 and LEA2 formed on upper and lower portions, and may be transparent and have a relatively high transmittance. Since the light emission regions LEA1 and LEA2 are vertically stacked with the intermediate layer 550 interposed therebetween, light emitted from the light emission regions LEA1 and LEA2 may be effectively mixed.

In another exemplary embodiment, the intermediate layer 550 may be formed of an insulating material of a light-transmitting material.

The light emitting diode of FIG. 14 may have various structures through patterning, and electrodes may be formed on the light emitting diode to fabricate a light emitting device. Hereinafter, various light emitting devices using the light emitting diode of FIG. 14 will be described with reference to FIG. 15 and FIG. 16.

Figure 15:
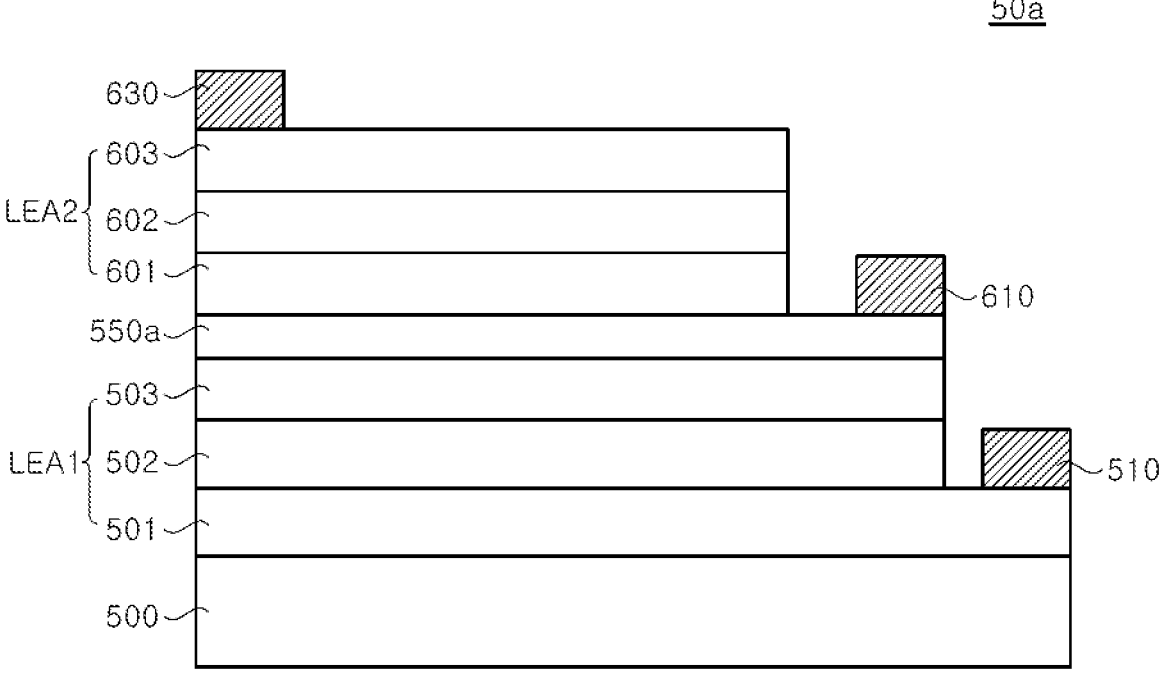
FIG. 15 is a schematic cross-sectional view illustrating an example of a light emitting device including the light emitting diode of FIG. 14.
Figure 16:
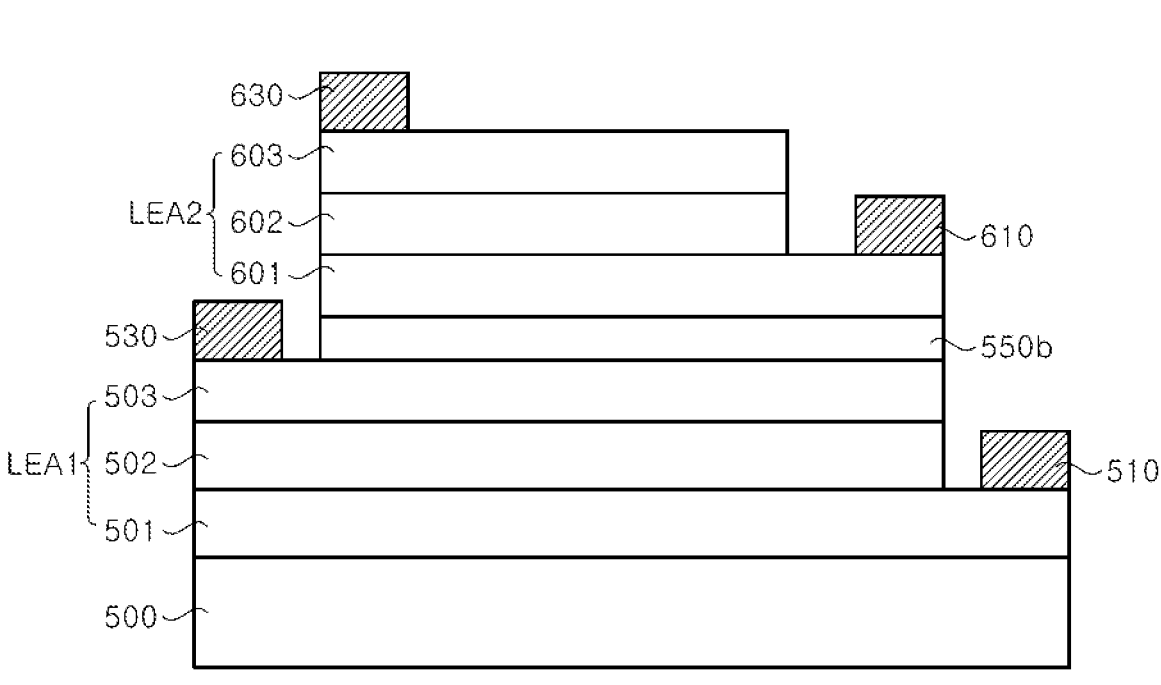
FIG. 16 is a schematic cross-sectional view illustrating another example of a light emitting device including the light emitting diode of FIG. 14.

FIG. 15 is a schematic cross-sectional view illustrating an example 50a of a light emitting device including the light emitting diode of FIG. 14, and FIG. 16 is a schematic cross-sectional view illustrating another example 50b of a light emitting device including the light emitting diode of FIG. 14.

Referring to FIG. 15, the light emitting device 50a includes the light emitting diode described with reference to FIG. 14 and electrodes 510, 610, and 630. In the illustrated exemplary embodiment, the intermediate layer 550 is formed of a tunnel junction layer 550a. An upper surface of the first conductivity type semiconductor layer 501 and an upper surface of the tunnel junction layer 550a are exposed through etching, and the first light emission region LEA1 has a larger area than the second light emission region LEA2. Etching can be carried out by plasma, wet, or inductively coupled plasma (ICP), reactive ion etch (ME) or the like, and during an etching process, side surfaces of the second conductivity type semiconductor layers 503 and 603 may be etched to generate defects, which are nitrogen vacancies acting as n-type impurities, and the side surfaces of the second conductivity type semiconductor layers 503 and 603 in which the defects are generated may function as barriers to prevent the second conductivity type semiconductor layers 503 and 603 from reacting with hydrogen. After the etching is carried out, a thermal annealing may be carried out to activate holes in the second conductivity type semiconductor layers 503 and 603.

Meanwhile, an electrode 510 may be electrically connected to the first conductivity type semiconductor layer 501. The electrode 510 may be disposed on a same plane as the light emission layer 502, and for example, may be disposed on the first conductivity type semiconductor layer 501. An electrode 610 may be electrically connected to the tunnel junction layer 550a and disposed on a same plane as the first conductivity type semiconductor layer 601. An electrode 630 may be electrically connected to the second conductivity type semiconductor layer 603. The electrode 630 may be disposed on, for example, the second conductivity type semiconductor layer 603.

In the illustrated exemplary embodiment, the light emitting device 50a is illustrated and described as having three electrodes 510, 610, and 630, but the present disclosure is not limited to a light emitting device including three electrodes. The number of electrodes NE may be at least one more than a number NL of the light emission layers (NE=NL+1), and may be twice of the number of light emission layers (NE=NL×2). The electrodes 510, 610, and 630 may be formed of a conductive material such as Al, Ni, Au, Ti, Pt, W, ITO, or ZnO.

The light emission regions LEA1 and LEA2 and the tunnel junction layer 550a may be formed monolithically using semiconductor layers continuously grown on the substrate 500. The light emitting device 50a supplies power to the stacked light emission regions LEA1 and LEA2 using the electrodes 510, 610, and 630, and thus, mixed light in which light of two or more colors is mixed, for example, white light may be emitted without a phosphor.

In an exemplary embodiment, the light emission layers 502 and 602 of the first light emission region LEA1 and the second light emission region LEA2 may have same compositions. For example, the well layers of the light emission layers 502 and 602 may include substantially same In contents. Alternatively, a difference in the In contents included in the well layers of the light emission layers 502 and 602 may be within 5%. Alternatively, a difference in peak wavelengths of light generated in the well layers of the light emission layers 502 and 602 may be within 15 nm. The first light emission region LEA1 disposed under the tunnel junction layer 550a may have a different area from that of the second light emission region LEA2 disposed over the tunnel junction layer 550a. Although the first light emission region LEA1 disposed under the tunnel junction layer 550a may have a larger area than that of the second light emission region LEA2, the inventive concepts are not limited thereto, and the second light emission region LEA2 disposed over the tunnel junction layer 550a may have a larger area than that of the first light emission region LEA1.

Even when the well layers of the first light emission region LEA1 and the second light emission region LEA2 have the same composition, since they have different areas from each other, current densities applied to the first and second light emission regions LEA1 and LEA2 are different from each other, and thus, the first and second light emission regions LEA1 and LEA2 may emit light of different colors from each other. By adjusting an area ratio of the first and second light emission regions LEA1 and LEA2, colors of light emitted from the first and second light emission regions LEA1 and LEA2 may be adjusted, and white light having various color temperatures may be implemented by mixing these lights.

Furthermore, when a current equal to a current applied to a single light emission region having a same area of the first and second light emission regions LEA1 and LEA2 is applied to the first and second light emission regions LEA1 and LEA2, since the currents density applied to the first and second light emission regions LEA1 and LEA2 is relatively high, a current for implementing white light may be reduced. Since the second light emission region LEA2 having a relatively smaller area is operated under a higher current density than that for the first light emission region LEA1, holes may be more rapidly injected into the second light emission region LEA2. Accordingly, the light emitting device 50a according to the illustrated exemplary embodiment may realize white light by injecting the current lower than the current applied to the light emitting device having the single light emission region.

In the illustrated exemplary embodiment, the light emitting device 50a may emit light toward the electrode 630, or alternatively, light may be emitted through the substrate 500. In this case, the light emitting device 50a may be flipbonded such that the electrodes 510, 610, and 630 are disposed between a light extraction surface and a circuit board.

The light emission regions LEA1 and LEA2 may be connected in series, or may be connected in parallel. When the light emission regions LEA1 and LEA2 are connected in series, the current densities applied to the light emission regions LEA1 and LEA2 may be adjusted differently while an amount of injected current is same, and when connected in parallel, the current densities applied to each of the light emission regions LEA1 and LEA2 may be further adjusted by adjusting the currents applied to the light emission regions LEA1 and LEA2. By adjusting the current densities applied to the light emission regions LEA1 and LEA2, light having a desired CIE color coordinate may be implemented.

In the previous embodiment, it has been described that the light emission regions LEA1 and LEA2 include the light emission layers 502 and 602 having the same composition, but the inventive concepts are not limited thereto. In another exemplary embodiment, the light emission regions LEA1 and LEA2 may include light emission layers 502 and 602 having different compositions from each other. That is, the light emission layer 502 of the first light emission region LEA1 and the light emission layer 602 of the second light emission region LEA2 may have different In or Al compositions from each other, and may have different energy band gaps from each other. Accordingly, even under the same current density, the color coordinates of light emitted from the first light emission region LEA1 and the second light emission region LEA2 may be different from each other. Either one of the first light emission region LEA1 or the second light emission region LEA2 may be configured to emit blue light having a multi-peak including a blue peak, and the other one may be configured to emit light having a red peak. In this case, the light emission region emitting light of the red peak may be disposed closer to a light exiting surface.

According to the illustrated exemplary embodiment, the light emitting device 50a may implement white light by mixing light emitted from the first light emission region LEA1 and the second light emission region LEA2. Furthermore, by employing the light emission layers having different compositions, light having a red component can be added, thereby improving a color rendering. For example, the light emitting device 50a may emit white light having a color rendering index (CRI) of 60 or more, and further, 80 or more.

In addition, the areas of the first light emission region LEA1 and the second light emission region LEA2 may be set to be different, and the light emission region emitting red light may have an area smaller or larger than those of other light emission regions according to CRI and CIE ranges.

The light emission region emitting red light, for example, the second light emission region LEA2 may emit light within a wavelength range of 550 nm to 700 nm, specifically, light within a range of 580 nm to 650 nm. When the first conductivity type semiconductor layer 601 and the second conductivity type semiconductor layer 603 are nitride-based, the light emission layer 602 may include In, and an In content may be 30% or more.

Referring to FIG. 16, the light emitting device 50b according to the illustrated exemplary embodiment is substantially similar to the light emitting device 50a described with reference to FIG. 15, except that it includes four electrodes 510, 530, 610, and 630. The electrodes 530 and 630 may be electrically connected to the second conductivity type semiconductor layers 503 and 603, and the electrodes 510 and 610 may be electrically connected to the first conductivity type semiconductor layers 501 and 601.

Meanwhile, in the illustrated exemplary embodiment, a bonding layer 550b may be disposed between the first light emission region LEA1 and the second light emission region LEA2. The bonding layer 550b may be formed of an insulating material, and thus, the first emission region LEA1 and the second emission region LEA2 may be electrically separated by the bonding layer 550b. However, the inventive concepts are not limited thereto, and the bonding layer 550b may be formed of a conductive material such as a transparent conductive layer.

The first light emission region LEA1 may receive power through the electrodes 510 and 530, and the second light emission region LEA2 may receive power through the electrodes 610 and 630. Accordingly, the first light emission region LEA1 and the second light emission region LEA2 may be driven independently of each other.

Figure 17:
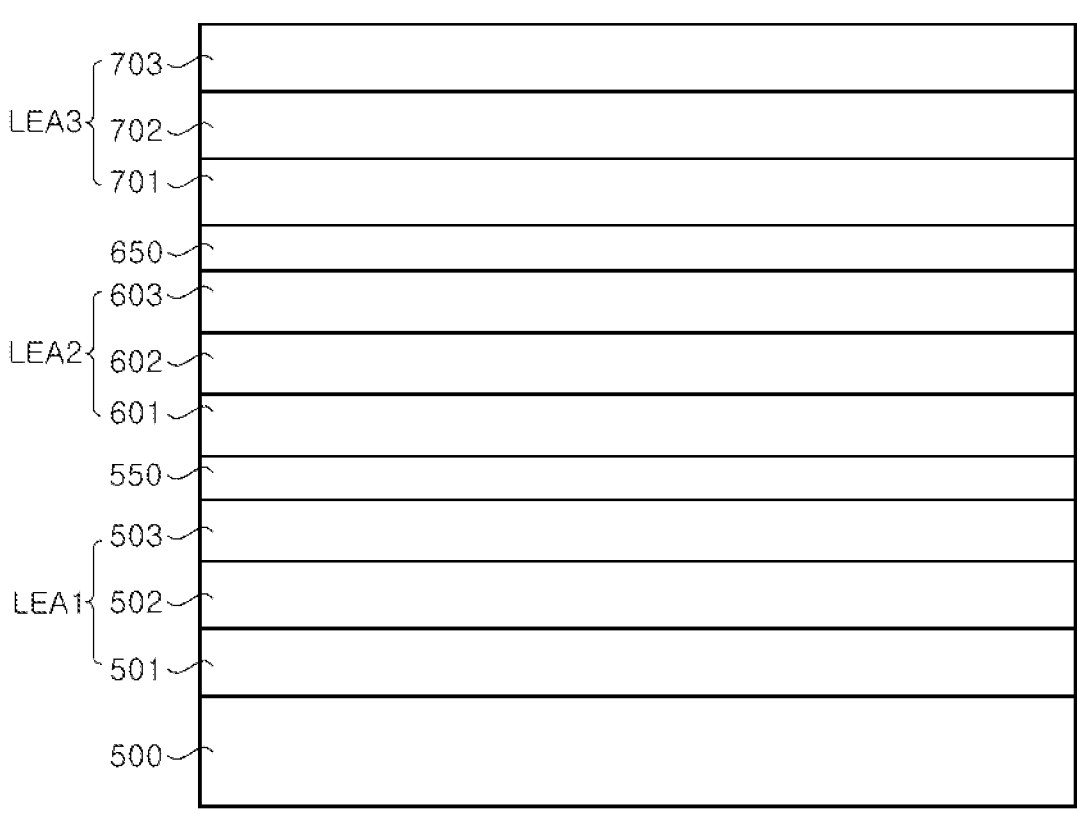
FIG. 17 is a schematic cross-sectional view illustrating a light emitting diode according to another exemplary embodiment.

FIG. 17 is a schematic cross-sectional view illustrating a light emitting diode according to another exemplary embodiment.

Referring to FIG. 17, the light emitting diode according to the illustrated exemplary embodiment is substantially similar to the light emitting diode described with reference to FIG. 14, except that it further includes an intermediate layer 650 and a third light emission region LEA3. That is, the light emitting diode according to the illustrated exemplary embodiment has a structure in which three light emission regions LEA1, LEA2, and LEA3 are vertically stacked, and the intermediate layers 550 and 650 are disposed between each of the light emission regions.

The intermediate layer 650 may be a tunnel junction layer or a bonding layer similar to the intermediate layer 550, and detailed description thereof will be omitted to avoid redundancy. Meanwhile, the third light emission region LEA3 includes a first conductivity type semiconductor layer 701, a light emission layer 702, and a second conductivity type semiconductor layer 703. The third light emission region LEA3 has a structure similar to that of the first light emission region LEA1 or the second light emission region LEA2, except that a composition of the light emission layer 702 may be same as or different from those of the light emission layers 502 and 602.

Figure 18:
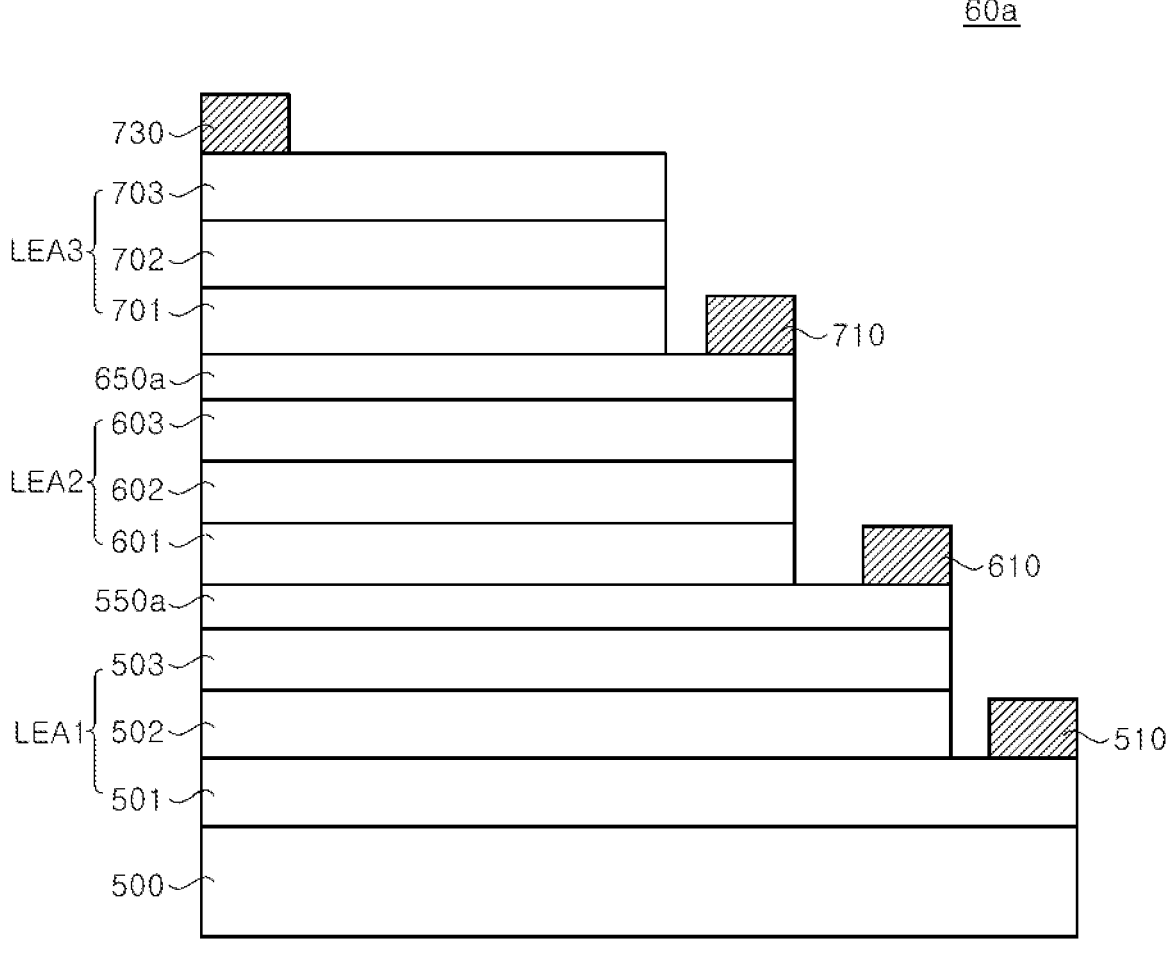
FIG. 18 is a schematic cross-sectional view illustrating an example of a light emitting device including the light emitting diode of FIG. 17.
Figure 19:
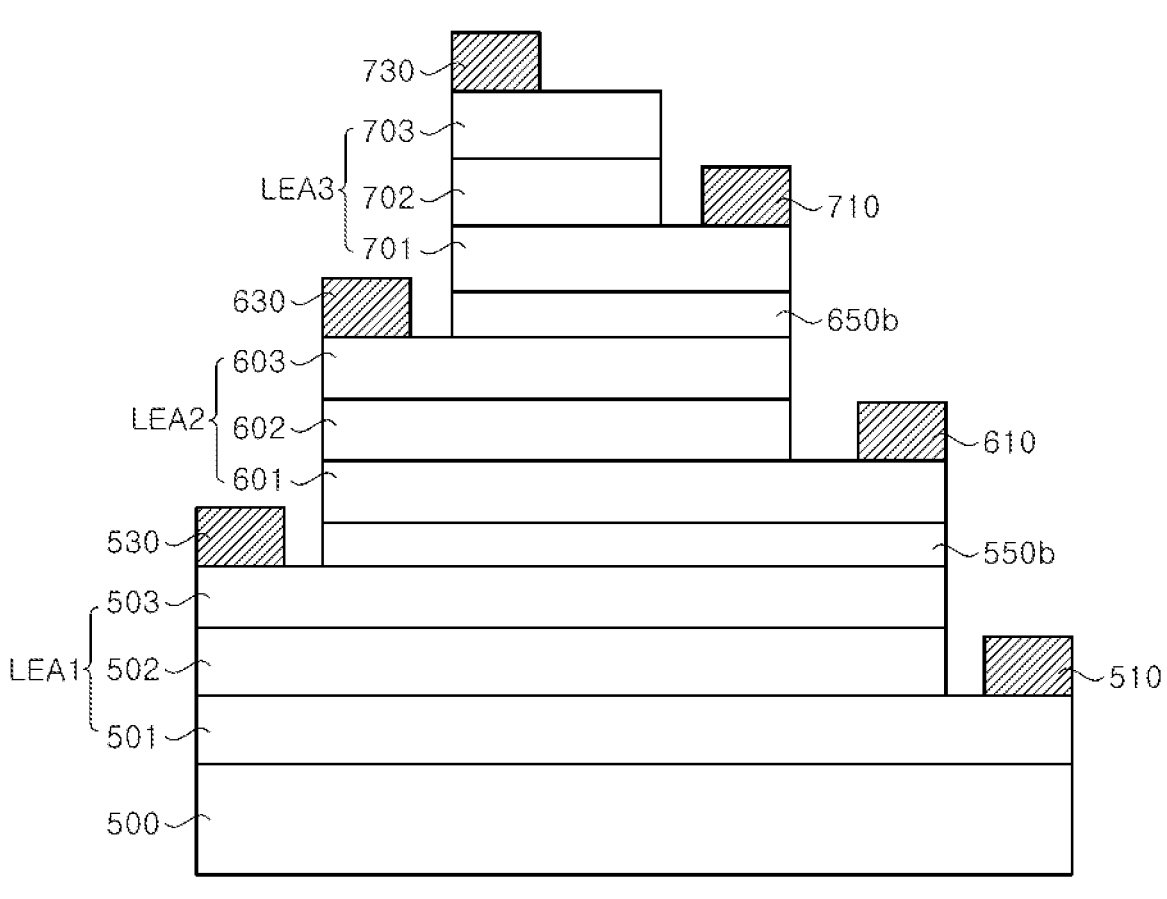
FIG. 19 is a schematic cross-sectional view illustrating another example of a light emitting device including the light emitting diode of FIG. 17.

FIG. 18 is a schematic cross-sectional view illustrating an example of a light emitting device including the light emitting diode of FIG. 17, and FIG. 19 is a schematic cross-sectional view illustrating another example of a light emitting device including the light emitting diode of FIG. 17.

First, referring to FIG. 18, a light emitting device 60a according to the illustrated exemplary embodiment may include the three light emission regions LEA1, LEA2, and LEA3 and four electrodes 510, 610, 710, and 730. The electrode 510 may be electrically connected to the first conductivity type semiconductor layer 501. The electrode 510 may be disposed on a same plane as the light emission layer 502, and for example, may be disposed on the first conductivity type semiconductor layer 501. The electrode 610 may be electrically connected to the tunnel junction layer 550a and disposed on a same plane as the first conductivity type semiconductor layer 601. The electrode 710 may be electrically connected to a tunnel junction layer 650a, and disposed on a same plane as the first conductivity type semiconductor layer 701. The electrode 730 may be electrically connected to the second conductivity type semiconductor layer 703. The electrode 730 may be disposed on, for example, the second conductivity type semiconductor layer 703.

In the illustrated exemplary embodiment, the light emission regions LEA1, LEA2, and LEA3 have different areas from one another, and may be driven under different current densities. The light emission regions LEA1, LEA2, and LEA3 may include the light emission layers 502, 602, and 702 having different compositions from one another, or may include light emission layers having a same composition as one another. Alternatively, only one of the light emission layers 502, 602, and 702 may have a composition different from those of the other light emission layers. For example, at least two light emission regions may emit blue light, and the other light emission region may emit red light. The light emission regions including the light emission layers having the same composition may have different areas from one another, and thus, may be operated under different current densities to emit light of different colors.

According to the illustrated exemplary embodiment, white light may be implemented under a relatively low current using the light emission regions LEA1, LEA2, and LEA3 having the different areas from one another, and furthermore, white light with high CRI may be implemented by further arranging the light emission region that emits red light.

Additionally, the light emission regions LEA1, LEA2, and LEA3 may include the light emission layers 502, 602, and 702 having the different compositions, and thus, the light emission regions LEA1, LEA2, LEA3 may emit red, blue, and green light, respectively, and white light may be implemented by mixing the emitted light. Accordingly, the light emitting device 60a may implement white light with high CRI without a phosphor.

Meanwhile, $SiO_2$, SiN, or Si-containing layer may be partially patterned and disposed between the second semiconductor layers 503 and 603 and the tunnel junction layers 550a and 650a, and thus, a luminous efficiency may be improved through current spreading. The semiconductor layers may be patterned through etching, and thereafter, the electrodes 510, 610, 710, and 730 may be formed. The etching may be carried out by plasma, wet, ICP, RIE, or the like, and during an etching process, defects of nitrogen vacancies are generated in side surfaces of the second conductivity type semiconductor layers 503, 603, and 703, so that the second conductivity type semiconductor layers 503, 603, and 703 may be prevented from reacting with hydrogen. After the etching process, thermal annealing may be carried out to activate holes in the second conductivity type semiconductor layers.

Referring to FIG. 19, a light emitting device 60b according to the illustrated exemplary embodiment is substantially similar to the light emitting device 60a described with reference to FIG. 18, except that it has six electrodes 510, 530, 610, 630, 710, and 730. Two electrodes are disposed on each of the light emission regions LEA1, LEA2, and LEA3. In addition, bonding layers 550b and 650b are disposed between the light emission regions LEA1, LEA2, and LEA3. Since the bonding layers 550b and 650b are same as the bonding layer 550b described with reference to FIG. 16, a detailed description thereof will be omitted.

In the illustrated exemplary embodiment, the light emission regions LEA1, LEA2, and LEA3 may be independently driven using the electrodes 510, 530, 610, 630, 710, and 730. The electrodes 530, 630, and 730 may be electrically connected to the second conductivity type semiconductor layers 503, 603, and 703, respectively, and the electrodes 510, 610, and 710 may be electrically connected to the first conductivity type semiconductor layers 501, 601, and 701, respectively.

Figure 20:
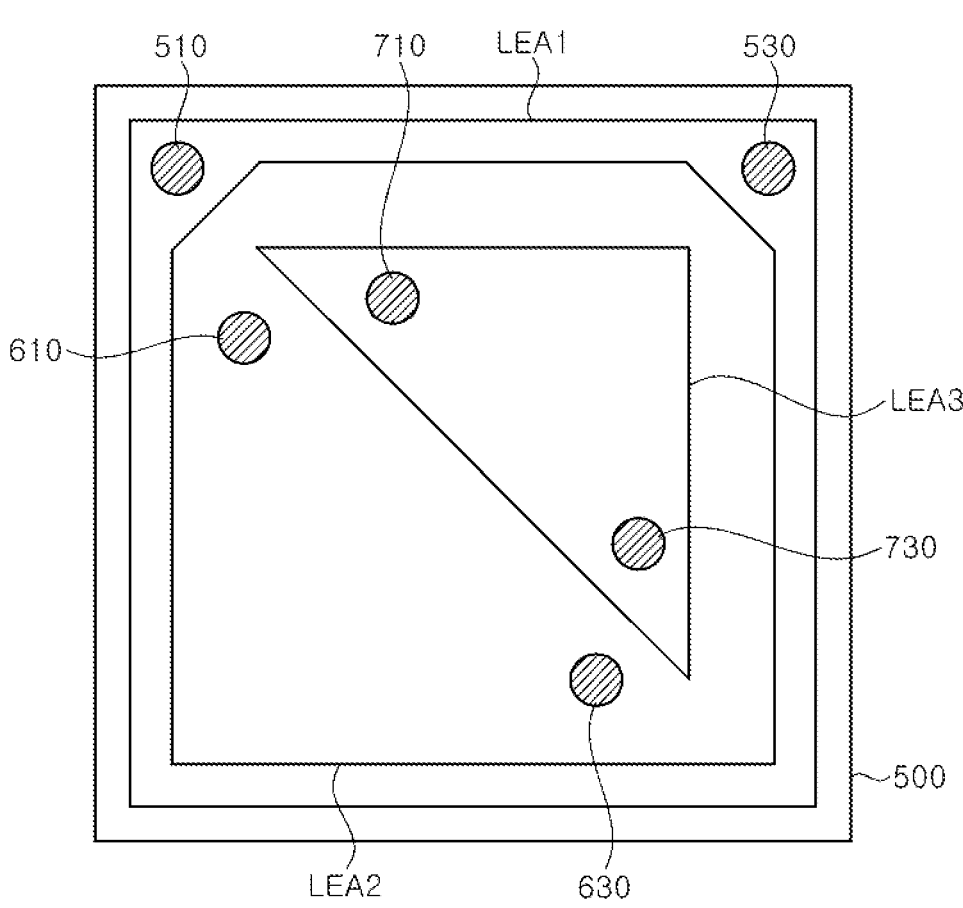
FIG. 20 is a schematic plan view illustrating another example of a light emitting device including the light emitting diode of FIG. 17.

FIG. 20 is a schematic plan view illustrating another example of a light emitting device including the light emitting diode of FIG. 17.

Referring to FIG. 20, the light emitting device according to the illustrated exemplary embodiment may include the light emission regions LEA1, LEA2, and LEA3 vertically stacked on a substrate 500, and the electrodes 510, 530, 610, 630, 710, and 730 as described with reference to FIG. 19.

The light emission regions LEA1, LEA2, and LEA3 may have various shapes in plan view. For example, the light emission regions LEA1, LEA2, and LEA3 may be polygonal. The number of edges of the polygon may be three, four, or five or more. In addition, at least one of the light emission regions LEA1, LEA2, and LEA3 may be circular.

As shown in FIG. 20, the second light emission region LEA2 having a smaller light emission region is disposed on the first light emission region LEA1 having a largest light emission region, the third light emission region LEA3 having a smallest area may be disposed on the second light emission region LEA2, and the electrodes 510, 530, 610, 630, 710, and 730 may be disposed on each of the light emission regions. Accordingly, the electrodes 510, 530, 610, 630, 710, and 730 may be easily formed, and different current densities may be applied to each of the light emission regions LEA1, LEA2, and LEA3.

With respect to the third light emission region LEA3 having the smallest area, a region in which all of the light emission regions LEA1, LEA2, and LEA3 overlap may be formed, and light emitted from the light emission regions LEA1, LEA2, and LEA3 is mixed in the overlapped region to implement improved white light.

Through all the exemplary embodiments described above, a light emitting device emitting light in which x and y ranges of CIE color coordinates are $0.205<x<0.495$ and $0.19<y<0.45$ may be realized.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. In addition, elements described in an embodiment may be applied to other embodiments without departing from the spirit of the present disclosure. Accordingly, it is therefore intended that the appended claims cover all such changes and modifications that are within the scope of the embodiments shown and described herein.

It should be understood that these embodiments are merely exemplary and are not intended to limit the scope of this disclosure.

What is claimed is:

1. A light emitting device module, comprising:
a circuit board;
a light emitting device disposed on the circuit board, the light emitting device comprising:
a first light emission region;
a second light emission region; and
a molding layer covering the first light emission region and the second light emission region,
wherein:
the first and second light emission regions include a first conductivity type semiconductor layer, a second conductivity type semiconductor layer, and an active region formed between the first conductivity type semiconductor layer and the second conductivity type semi-conductor layer, respectively, an area of the first light emission region is larger than that of the second light emission region, and light emitted from the first light emission region and the second light emission region has a first peak wavelength and a second peak wavelength shorter than the first peak wavelength, and an intensity of the first peak wavelength is less than an intensity of the second peak wavelength, and the light emitting device emits light having x and y ranges of 0.205<x<0.495, 0.19<y<0.45 in the CIE color coordinates from the molding layer.

2. The light emitting device of claim 1, wherein, upon operation, the first light emission region and the second light emission region are operated under different current densities from each other.

3. The light emitting device of claim 1, wherein the first light emission region is connected in series or parallel to the second light emission region.

4. The light emitting device of claim 1, further comprising:

a substrate, wherein the first light emission region and the second light emission region are disposed on the substrate.

5. The light emitting device of claim 1, wherein the active region of the first light emission region has a same composition as the active region of the second light emission region.

6. The light emitting device of claim 1, further comprising:

a first substrate; and a second substrate spaced apart from the first substrate, wherein:

the first light emission region is disposed on the first substrate, and the second light emission region is disposed on the second substrate.

7. The light emitting device of claim 1, wherein the first light emission region and the second light emission region emit light of a plurality of peak wavelengths, respectively, a difference between the peak wavelengths emitted from the first light emission region and the second light emission region is within 15 nm, and intensities at each peak wavelength are different from one another.

8. The light emitting device of claim 1, further comprising:

a wavelength converter covering the first light emission region and the second light emission region, wherein the wavelength converter includes a wavelength conversion material for converting light emitted from the first light emission region and the second light emission region to light of a longer wavelength.

9. The light emitting device of claim 1, wherein the first light emission region has an area equal to or greater than 1.2 times an area of the second light emission region.

10. The light emitting device of claim 1, the active region comprising:

a lower multi-quantum well structure and an upper multi-quantum well structure formed between the first conductivity type semiconductor layer and the second conductivity type semiconductor layer; and a gap layer disposed between the lower multi-quantum well structure and the upper multi-quantum well structure.

11. The light emitting device of claim 1, wherein x and y values of CIE color coordinates decrease as an applied current increases.

12. The light emitting device of claim 1, wherein the first light emission region and the second light emission region are stacked so that at least portions of the first light emission region and the second light emission region vertically overlap.

13. The light emitting device of claim 12, further comprising:

an intermediate layer disposed between the first light emission region and the second light emission region.

14. The light emitting device of claim 12, wherein the intermediate layer is a tunnel junction layer or a bonding layer.

15. The light emitting device of claim 12, further comprising:

a third light emission region stacked on the second light emission region, wherein the third light emission region includes a first conductivity type semiconductor layer, a second conductivity type semiconductor layer, and an active region disposed between the first conductivity type semiconductor layer and the second conductivity type semiconductor layer.

16. A light emitting module, comprising:

a circuit board;

a light emitting device disposed on the circuit board, the light emitting device comprising:

a first light emission region;

a second light emission region; and a molding layer covering the first light emission region and the second light emission region, wherein:

the first and second light emission regions include a first conductivity type semiconductor layer, a second conductivity type semiconductor layer, and an active region formed between the first conductivity type semiconductor layer and the second conductivity type semiconductor layer, respectively, an area of the first light emission region is larger than an area of the second light emission region, and the first light emission region and the second light emission region emit light having a first peak wavelength and a second peak wavelength shorter than the first peak wavelength, and an intensity of the first peak wavelength is less than an intensity of the second peak wavelength, and the light emitting module emits light having x and y ranges of 0.205<x<0.495, 0.19<y<0.45 in the CIE color coordinates from the molding layer.

17. The light emitting module of claim 16, comprising:

a first light emitting diode chip and a second light emitting diode chip, wherein:

the first light emitting diode chip includes the first light emission region, and the second light emitting diode chip includes the second light emission region.

18. The light emitting module of claim 17, further comprising:

a wavelength converter covering the first and second light emitting diode chips, wherein the wavelength converter includes a wavelength conversion material for converting light emitted from the first light emission region and the second light emission region to light of a longer wavelength.

\* \* \* \* \*